US008164918B2

(12) United States Patent
Chow et al.

(10) Patent No.: US 8,164,918 B2
(45) Date of Patent: Apr. 24, 2012

(54) STEERING FABRIC THAT FACILITATES REDUCING POWER USE FOR PROXIMITY COMMUNICATION

(75) Inventors: Alex Chow, Palo Alto, CA (US); Robert J. Drost, Los Altos, CA (US); Ronald Ho, Mountain View, CA (US); Robert Proebsting, Sonora, CA (US); Arlene Proebsting, legal representative, Sonora, CA (US)

(73) Assignee: Oracle America, Inc., Redwood Shores, CA (US)

( * ) Notice: Subject to any disclaimer, the term of this patent is extended or adjusted under 35 U.S.C. 154(b) by 605 days.

(21) Appl. No.: 12/317,659

(22) Filed: Dec. 24, 2008

(65) Prior Publication Data

US 2009/0205850 A1    Aug. 20, 2009

Related U.S. Application Data

(60) Provisional application No. 61/024,472, filed on Jan. 29, 2008.

(51) Int. Cl.
*H05K 7/00* (2006.01)

(52) U.S. Cl. ....................................... 361/777
(58) Field of Classification Search ............... 174/126.1; 361/767, 777
See application file for complete search history.

(56) References Cited

U.S. PATENT DOCUMENTS

| | | | | |
|---|---|---|---|---|
| 5,315,485 | A * | 5/1994 | Magill et al. | 361/767 |
| 6,188,580 | B1 * | 2/2001 | Huber et al. | 361/737 |
| 6,191,951 | B1 * | 2/2001 | Houdeau et al. | 361/737 |
| 6,437,990 | B1 * | 8/2002 | Degani et al. | 361/783 |
| 6,678,167 | B1 * | 1/2004 | Degani et al. | 361/760 |
| 6,812,046 | B2 * | 11/2004 | Drost et al. | 438/14 |
| 6,917,219 | B2 * | 7/2005 | New | 326/41 |
| 6,995,039 | B2 * | 2/2006 | Harris et al. | 438/107 |
| 7,068,072 | B2 * | 6/2006 | New et al. | 326/47 |
| 7,239,525 | B2 * | 7/2007 | Hsu | 361/763 |
| 7,292,050 | B1 * | 11/2007 | Chow et al. | 324/681 |
| 7,425,836 | B2 * | 9/2008 | Chow et al. | 324/681 |
| 7,649,255 | B2 * | 1/2010 | Chow et al. | 257/723 |
| 7,871,833 | B2 * | 1/2011 | Chow et al. | 438/14 |
| 7,949,436 | B2 * | 5/2011 | Drost et al. | 700/302 |
| 2004/0090756 | A1 * | 5/2004 | Ho et al. | 361/767 |
| 2005/0054139 | A1 * | 3/2005 | Drost et al. | 438/106 |
| 2007/0268125 | A1 * | 11/2007 | Ho et al. | 340/539.1 |
| 2008/0185614 | A1 * | 8/2008 | Gamand et al. | 257/203 |
| 2008/0208521 | A1 * | 8/2008 | Drost et al. | 702/150 |

(Continued)

*Primary Examiner* — Dameon Levi
*Assistant Examiner* — Theron Milliser
(74) *Attorney, Agent, or Firm* — Park, Vaughan, Fleming & Dowler LLP

(57) ABSTRACT

One embodiment of the present invention provides a system that facilitates reducing the power needed for proximity communication. This system includes an integrated circuit with an array of transmission pads that transmit signals using proximity communication. This array is comprised of a set of macropads, where each given macropad is comprised of a set of micropads that can be configured to transmit a signal. A steering fabric routes signals to and within macropads, such that a subset of the micropads in the array can be configured to transmit the signal to a receiving component. Each macropad receives a limited number of input signals, with the steering fabric routing input signals to the micropads of the macropads. By limiting the number of input signals that are routed to the micropads of the macropads, the steering fabric eliminates redundant steering configurations for the array and reduces the power needed to transmit the signal.

20 Claims, 21 Drawing Sheets
(13 of 21 Drawing Sheet(s) Filed in Color)

U.S. PATENT DOCUMENTS

| | | | | |
|---|---|---|---|---|
| 2008/0266824 A1* | 10/2008 | Wang | | 361/767 |
| 2009/0176450 A1* | 7/2009 | Chow et al. | | 455/41.1 |
| 2009/0189241 A1* | 7/2009 | Chow et al. | | 257/503 |
| 2009/0189674 A1* | 7/2009 | Chow et al. | | 327/390 |
| 2009/0268419 A1* | 10/2009 | Choi et al. | | 361/767 |
| 2009/0279571 A1* | 11/2009 | Chow et al. | | 370/479 |

* cited by examiner

○ — DATA FEEDING POINT
⋯⋯ — MACROPAD CELL BOUNDARY

SOUTH BIT FOR NORTH MACROPAD 202

NORTH BIT FOR SOUTH MACROPAD 204

DATA FEEDING POINT 200

····· — MACROPAD CELL BOUNDARY

◯ — FIRST-LEVEL (VERTICAL) MUX
▮ — SECOND-LEVEL (HORIZONTAL) MUX
━ — DATA FROM SELF ("ME")
━ — DATA FROM WEST NEIGHBOR ("fromW")
━ — DATA FROM EAST NEIGHBOR ("fromE")

|  | COLUMN 1 | COLUMN 2 | COLUMN 3 | COLUMN 4 |
|---|---|---|---|---|
| ROW 1 | N: 48%<br>S: 12%<br>W: 40% | N: 64%<br>S: 16%<br>W: 20% | N: 64%<br>S: 16%<br>E: 20% | N: 48%<br>S: 12%<br>E: 40% |
| ROW 2 | N: 36%<br>S: 24%<br>W: 40% | N: 48%<br>S: 32%<br>W: 20% | N: 48%<br>S: 32%<br>E: 20% | N: 36%<br>S: 24%<br>E: 40% |
| ROW 3 | N: 24%<br>S: 36%<br>W: 40% | N: 32%<br>S: 48%<br>W: 20% | N: 32%<br>S: 48%<br>E: 20% | N: 24%<br>S: 36%<br>E: 40% |
| ROW 4 | N: 12%<br>S: 48%<br>W: 40% | N: 16%<br>S: 64%<br>W: 20% | N: 16%<br>S: 64%<br>E: 20% | N: 12%<br>S: 48%<br>E: 40% |

FIG. 10A

|  | COLUMN 1 | COLUMN 2 | COLUMN 3 | COLUMN 4 |
|---|---|---|---|---|
| ROW 1 | N: 50%<br>S: 0%<br>W: 50% | N: 75%<br>S: 0%<br>W: 25% | N: 100%<br>S: 0%<br>E: 0% | N: 75%<br>S: 0%<br>E: 25% |
| ROW 2 | N: 37.5%<br>S: 12.5%<br>W: 50% | N: 56.25%<br>S: 18.75%<br>W: 25% | N: 75%<br>S: 25%<br>E: 0% | N: 56.25%<br>S: 18.75%<br>E: 25% |
| ROW 3 | N: 25%<br>S: 25%<br>W: 50% | N: 37.5%<br>S: 37.5%<br>W: 25% | N: 50%<br>S: 50%<br>E: 0% | N: 37.5%<br>S: 37.5%<br>E: 25% |
| ROW 4 | N: 12.5%<br>S: 37.5%<br>W: 50% | N: 18.75%<br>S: 56.25%<br>W: 25% | N: 25%<br>S: 75%<br>E: 0% | N: 18.75%<br>S: 56.25%<br>E: 25% |

FIG. 10B

······ — MACROPAD CELL BOUNDARY

STEERING FABRIC THAT FACILITATES REDUCING POWER USE FOR PROXIMITY COMMUNICATION

RELATED APPLICATION

This application claims the benefit of U.S. Provisional Application No. 61/024,472, entitled "Power Optimized Techniques for Electronic Alignment Correction," by inventors Alex Chow, Robert J. Drost, and Ronald Ho, filed on 29 Jan. 2008. The subject matter of this application is also related to the subject matter in a co-pending non-provisional application by the same inventors as the instant application, entitled "A Circuit that Facilitates Proximity Communication," having Ser. No. 12/215,943, and filed on 30 Jun. 2008. The subject matter of this application is also related to the subject matter in a co-pending non-provisional application by the same inventors as the instant application and filed on the same day as the instant application, entitled "Using Floating Fill Metal to Reduce Power Use for Proximity Communication," having Ser. No. 12/317,606 TO BE ASSIGNED, and filing date of 24 Dec. 2008.

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention generally relates to semiconductor integrated circuits. More specifically, the present invention relates to techniques that facilitate proximity communication between semiconductor integrated circuits.

2. Related Art

Proximity communication techniques have been developed to facilitate communication between semiconductor chips. One promising proximity communication technique involves integrating arrays of capacitive transmitters and receivers onto semiconductor chips to facilitate inter-chip communication. For instance, a first chip can be situated face-to-face with a second chip so that transmitter pads on the first chip are capacitively coupled with receiver pads on the second chip, thereby allowing the first chip to transmit data signals directly to the second chip without having to route the data signals through intervening signal lines within a printed circuit board. Such capacitive communication techniques can greatly increase the communication bandwidth between chips, but they depend upon precise alignment between the associated communications components. For example, the effectiveness of capacitive coupling often depends on the alignment of the transmitter pads and the receiver pads.

Because sub-optimal alignment can reduce inter-chip communication performance and increase power consumption, some proximity communication systems employ electronic alignment techniques that dynamically correct the alignment of components to compensate for mechanical misalignment. For instance, each transmit pad may be split into an array of micropads that is supported by circuitry that can steer data to a subset of micropads that optimally overlaps with a receiving pad. Unfortunately, providing such circuitry to steer data is costly and consumes additional power.

Hence, what is needed are structures and methods that allow high-bandwidth communication between chips without the above-described problems.

SUMMARY

One embodiment of the present invention provides a system that facilitates reducing the power needed for proximity communication. This system includes an integrated circuit with an array of transmission pads that transmit signals using proximity communication. This array is comprised of a set of macropads, where each given macropad is comprised of a set of micropads that can be configured to transmit a signal. A steering fabric routes signals to and within macropads, such that a subset of the micropads in the array can be configured to transmit the signal to a receiving component. Each macropad receives a limited number of input signals, with the steering fabric routing input signals to the micropads of the macropads. By limiting the number of input signals that are routed to the micropads of the macropads, the steering fabric eliminates redundant steering configurations for the array and reduces the power needed to transmit the signal.

In some embodiments, the limited number of input signals received by each given macropad is less than the number of micropads in each macropad. Some of the input signals for a given macropad may be routed to a limited set of micropads in the macropad. Reducing the number of input signals that can be routed to a micropad simplifies the steering logic for the given macropad and facilitates reducing the power needed to transmit the signal.

In some embodiments, a subset of the micropads for a given macropad is coupled to two or fewer of the input signals. Note that some of the input signals may be routed to the macropad via the steering fabric in an adjacent macropad.

In some embodiments, the micropads in a given macropad are organized as a rectangular grid. A row and/or a column of micropads in this rectangular grid may be limited to receive two or fewer input signals.

In some embodiments, the steering fabric facilitates electronic alignment techniques that use a set of micropads that span multiple macropads to transmit a signal to the receiving component using proximity communication.

In some embodiments, a redundant steering configuration occurs when multiple different sets of input values for the steering fabric result in the same configuration of transmit values for the array. Eliminating redundant steering configurations reduces the complexity and power usage of the steering fabric while still allowing signals transmitted by the micropads to be electronically aligned to match a full range of receiving component locations.

In some embodiments, the different micropads in a given macropad have different probabilities of being driven by a given input signal. A signal line that carries an input signal can be routed in proximity to micropads that are more likely to be driven by that input signal, thereby reducing the average parasitic capacitance between the signal line and micropads that are more likely to be driven by other input signals.

In some embodiments, the layout of the steering fabric for the given macropad is replicated across some or all of the macropads in the array of transmission pads.

BRIEF DESCRIPTION OF THE FIGURES
COLOR DRAWINGS

The patent or application file contains at least one drawing executed in color. Copies of this patent or patent application publication with color drawing(s) will be provided by the Office upon request and payment of the necessary fee.

FIG. 10A illustrates the computed routing probabilities for the 4×4 micropad array structure illustrated in FIG. 2E in accordance with an embodiment of the present invention.

FIG. 10B illustrates the computed routing probabilities for the more power-optimal micropad array illustrated in FIG. 4A in accordance with an embodiment of the present invention.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Electronic Alignment Correction for Proximity Communication

Proximity communication typically requires precise alignment of two communicating components (e.g., two semiconductor chips) in order to ensure that the transmitting and receiving pads provide adequate signal coupling. Electronic alignment correction relaxes the need for tight mechanical alignment and mitigates misalignment of chips during operation due to vibrations and thermal expansion. For instance, a transmit region may be composed of a number of micropads which can be dynamically grouped together to send a uniform signal to a complementary receiving pad. A proximity communication system may include measurement sensors that determine the placement and alignment of two communicating components, and then ensure that data signals are steered correctly from transmit pads to receiving pads.

Figure 1A:
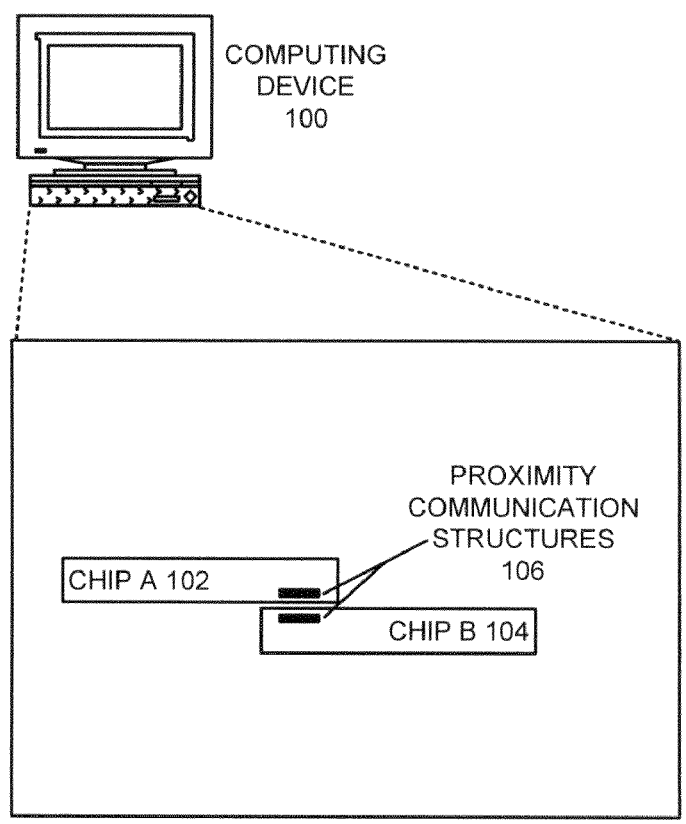
FIG. 1A illustrates two exemplary semiconductor chips that communicate using a set of proximity communication structures in accordance with an embodiment of the present invention.

FIG. 1A illustrates two exemplary semiconductor chips in a computing device 100, chip A 102 and chip B 104, that communicate using a set of proximity communication structures 106. Note that chip A 102 and chip B 104 might not be physically connected in any way, and may communicate purely using the proximity communication (e.g., capacitive coupling, or other proximity communication techniques). Note also that proximity communication is not limited to the arrangement illustrated in FIG. 1A, but may include a range of other proximity communication configurations and/or components, including, but not limited to, different locations for proximity communication structures, different alignments, bridge structures, and/or flexible wire structures.

Figure 1B:
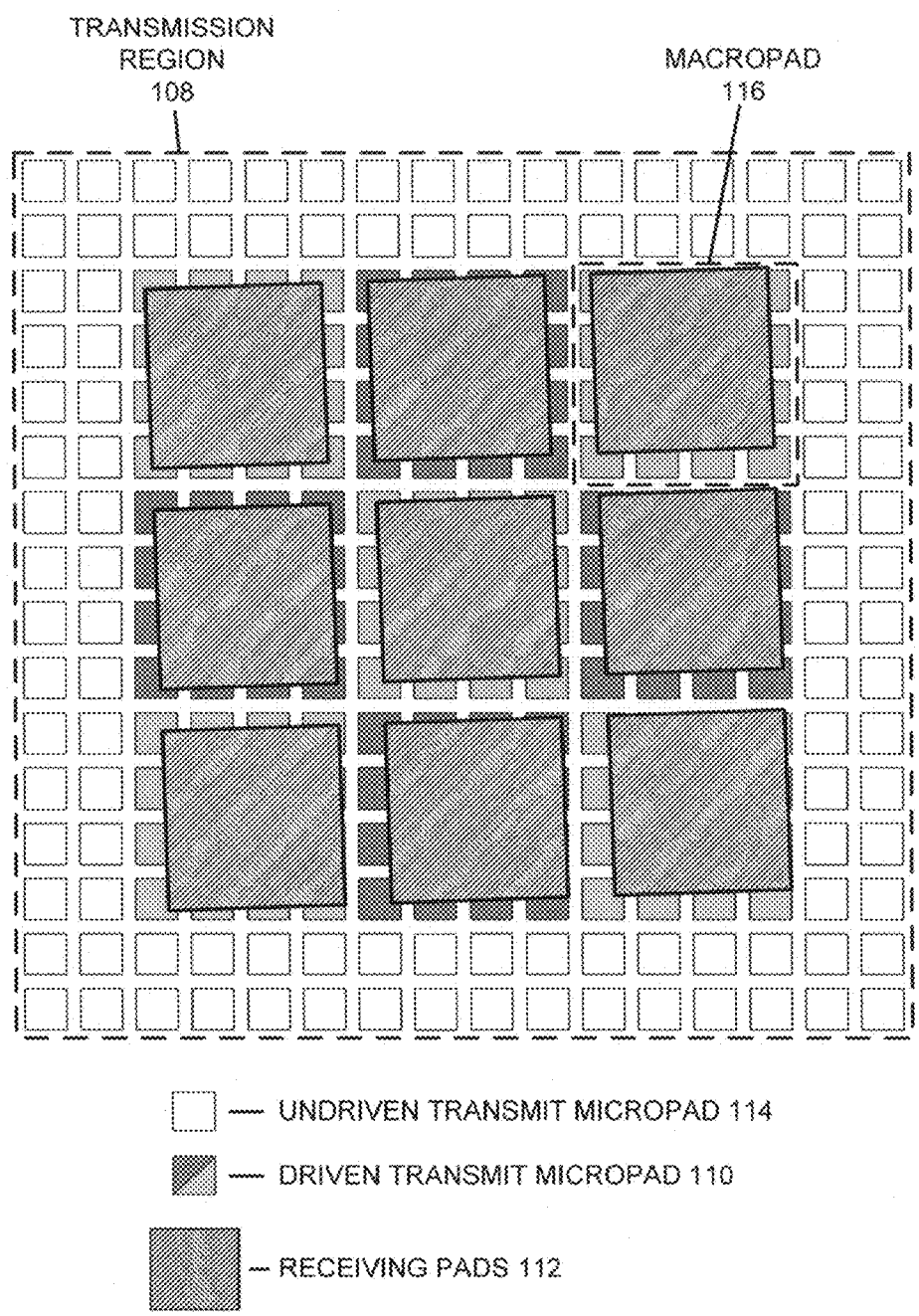
FIG. 1B illustrates an array of micropads that have been dynamically grouped to transmit signals to a complementary set of receiving pads in accordance with an embodiment of the present invention.

FIG. 1B illustrates an array of micropads that have been dynamically grouped to transmit signals to a complementary set of receiving pads. In FIG. 1B, transmission region 108 is electronically configured to drive a set of transmit micropads 110 that correspond most closely to the layout and location of receiving pads 112. Transmit micropads that are not in proximity to receiving pads 112 are undriven 114, but may be used subsequently if conditions cause the location of receiving pads 112 to move with respect to the transmission region 108. Note that micropads can be grouped together to form logical transmit "macropads" (in this example, 4×4 groups of micropads, as indicated by the groups of green and yellow micropads that correspond to the size and spacing of receiving pads 112), such as macropad 116, each of which transmits the same signal to one receiving pad on the receiving chip. A switching fabric in transmission region 108 steers data to micropads that provide optimal overlap for each given receiving pad. The dynamic capabilities of the transmit micropads and switching fabric can be used to compensate for mechanical misalignment of the chips, and can thereby facilitate dynamic alignment correction.

Figure 2A:
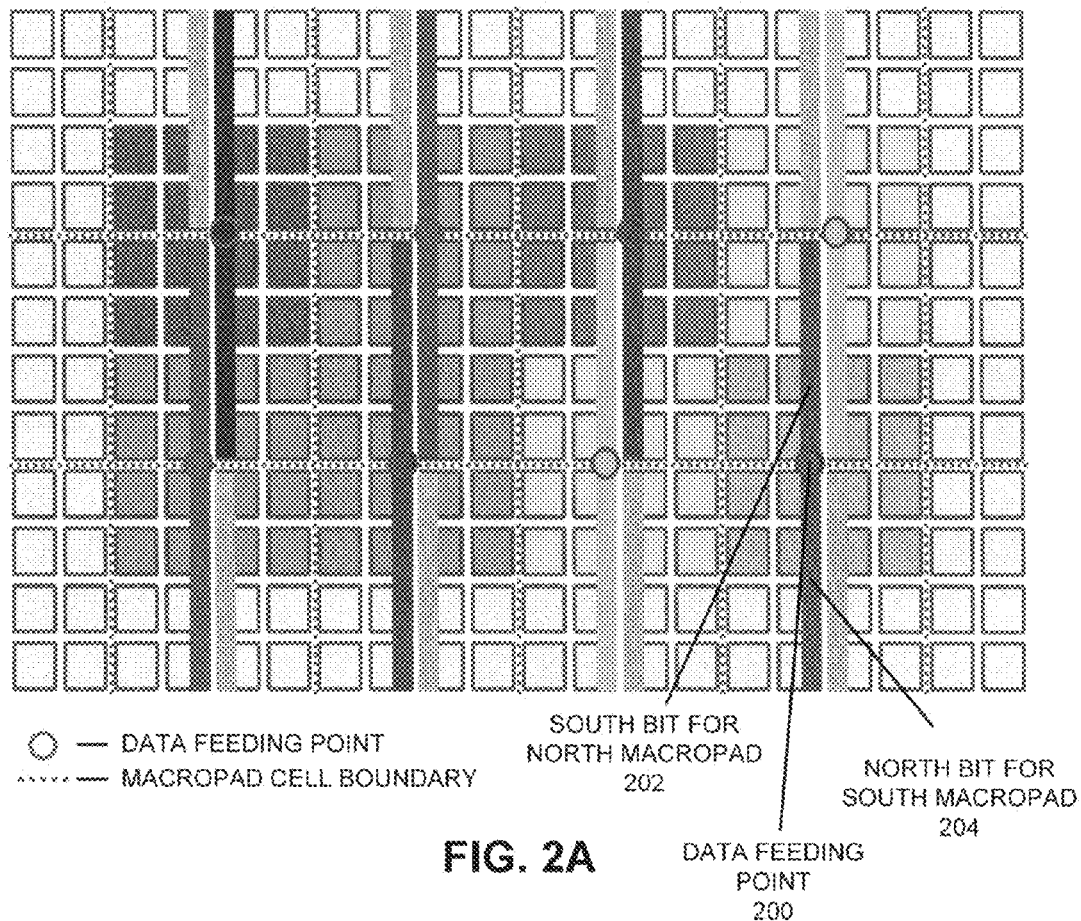
FIG. 2A illustrates the vertical distribution of data in an exemplary switching fabric in accordance with an embodiment of the present invention.

FIGS. 2A-2E illustrate an exemplary implementation of switching fabric that facilitates electronic alignment correction. In FIGS. 2A-2E, the data steering logic employs two stages. Each data bit is first distributed across two macropad pitches, as shown in FIG. 2A, where the dotted lines show the macropad cell boundaries. Note that these physical macropads are different from the logical macropads described above, which are groupings of micropads that transmit the same signal to a given receiving pad. In contrast, a physical macropad (referred to simply as a macropad in the following description) is a physical group of micropads and supporting circuitry that is repeated through the steering fabric to support electronic alignment correction.

Figure 2B:
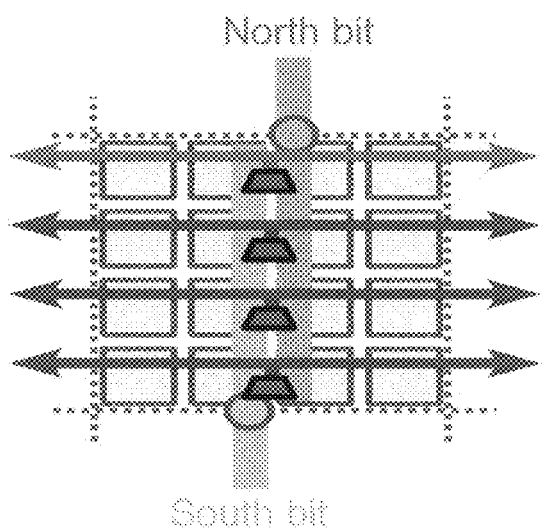
FIG. 2B illustrates the multiplexing of a vertical data signal across the rows of the exemplary switching fabric of FIG. 2A in accordance with an embodiment of the present invention.

A given macropad receives two vertical data bits, from the north and south sides of the cell (as shown in FIG. 2B), and can determine on a row-by-row basis whether a given row will receive a data signal from the north or south bit. For example, in FIG. 2A, a data bit fed into data feeding point 200 can be routed to eight rows of micropads (as indicated by the blue vertical bit line above and below data feeding point 200), with the vertical bit lines overlapping such that each given vertical data signal is fed to two macropads. In FIG. 2A, data feeding point 200 feeds the south bit for the macropad that is located north 202 of data feeding point 200, and feeds the north bit for the macropad south 204 of data feeding point 200.

Figure 2C:
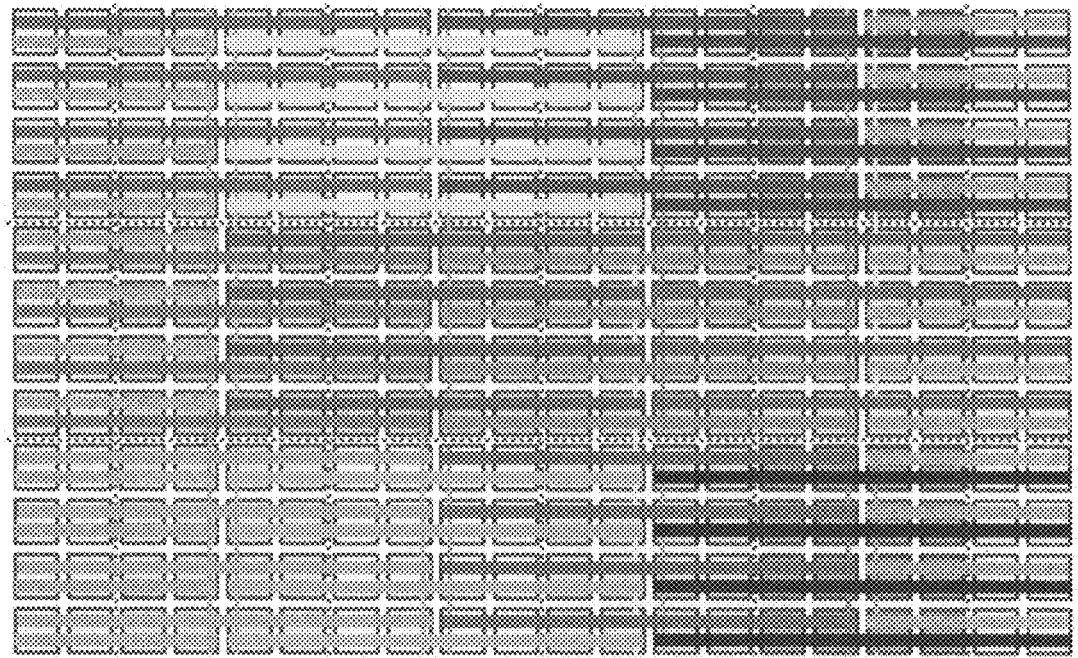
FIG. 2C illustrates the horizontal distribution of data in the exemplary switching fabric of FIGS. 2A-2B in accordance with an embodiment of the present invention.
Figure 2D:
FIG. 2D illustrates the multiplexing of a horizontal data signal across the micropads of the exemplary switching fabric of FIGS. 2A-2C in accordance with an embodiment of the present invention.

In the second stage, vertical bits are distributed across the rows of the switching fabric. For each row, a data signal received from a vertical bit line in the center of the macropad is then driven onto a horizontal wire that spans a total width of two macropads, thereby covering both the originating macropad (referred to as "me") as well as half of a macropad pitch into the neighboring macropads to the east and west. For instance, for a switching fabric with macropads that are four micropads wide and high (as shown in FIGS. 2A-2E), the horizontal extent of a horizontal wire spans eight micropads (as shown in FIG. 2C), with the left half of each macropad row receiving a bit from a west neighbor (referred to as "fromW"), and the right half of each macropad row receiving a bit from an east neighbor (referred to as "fromE") (as shown in FIG. 2D). Hence, after a first level of multiplexing selects either the north or south bit for a given row (as shown in FIG. 2B), a second level of multiplexing enables selecting whether to drive each micropad either from one of the macropad's vertical feeds ("me") or from a horizontal neighboring cell's vertical feed (either "fromE" or "fromW," depending on the location of the micropad in the macropad), as shown in FIG. 2D.

Figure 2E:
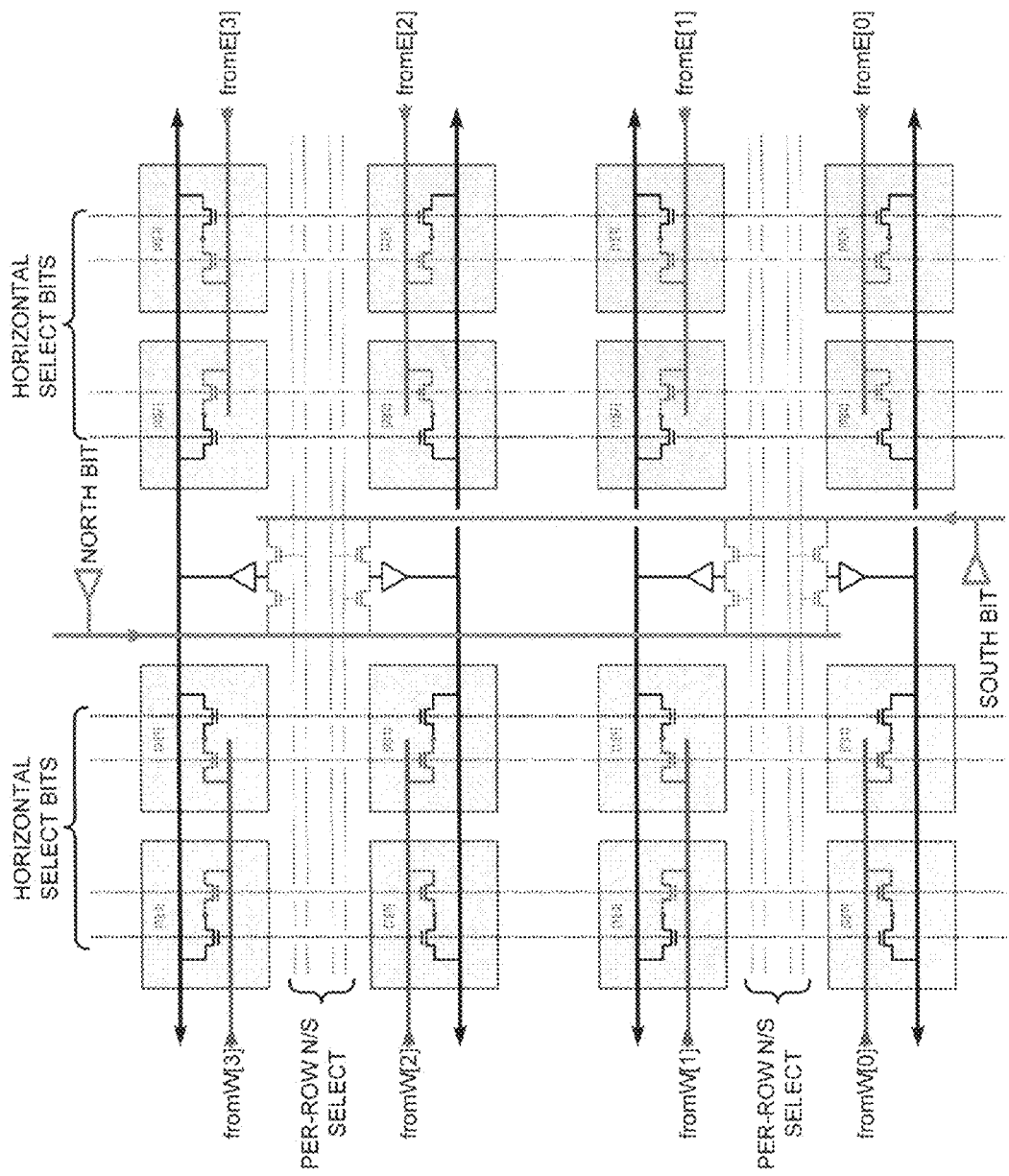
FIG. 2E illustrates exemplary electronic alignment circuitry that implements the steering capabilities illustrated in FIGS. 2A-2D for the exemplary switching fabric in accordance with an embodiment of the present invention.

FIG. 2E illustrates exemplary electronic alignment circuitry that implements the steering capabilities illustrated in FIGS. 2A-2D for a 4×4 micropad partitioning of one transmission macropad cell. FIG. 2E illustrates both of the above-described levels of multiplexing, where each pair of transistors illustrated in FIG. 2E is a representation of a two-to-one multiplexer, and some additional circuitry is not shown. Note that the circuitry illustrated in FIG. 2E is repeated throughout the switching fabric (using different data and signal lines, of course). Note also that receiving pads are not constrained to be the size of 4×4 micropads (as illustrated in FIG. 1B), but may also be either larger or smaller than the pitch of macropads in the steering fabric.

Note that while the switching fabric illustrated in FIGS. 2A-2E facilitates flexibly adjusting sets of transmit micropads used to transmit data to match the location and orientation of (misaligned) receiving pads, the switching fabric that steers data in the transmit array (e.g., a large number of multiplexers, data lines, and signal lines) consumes considerable area and power.

For instance, the cost in gates and power for a transmit macropad with N×N micropads scales with $N^2$. Even for a coarsely partitioned 4×4 array (where N=4), the cost in transmit power is about nine to twelve times the power that is needed to drive signals without electronic alignment correction, with substantially similar speed performance. Hence, techniques that reduce the power consumed by electronic alignment correction are important for enabling proximity communication in modern integrated circuit designs.

Some embodiments of the present invention reduce the power consumed by transmitter steering circuitry needed for electronic alignment correction by:

hard-wiring columns and/or rows of micropads in the steering fabric;

using thick-oxide NMOS transistor pass-gates in the steering fabric;

using bootstrapped NMOS transistor pass-gates in the steering fabric;

using floating fill metal to reduce parasitic pad capacitance;

routing signals over areas with probabilistically favorable coupling; and/or using a checkerboard micropad array.

These techniques are described in the following sections.

Hard-Wiring Micropads in the Steering Fabric

In the exemplary steering fabric illustrated in FIG. 2E, every micropad can be switched to one of four data values (e.g., the north and south data bits from the micropad's own macropad cell, or the north and south data bits from one of the horizontal neighboring macrocell neighbors, fromE and fromW). This organization allows (N+1) possible steering configurations in each dimension (e.g., one to four micropads on, or all micropads off), for a total of (N+1)2 positions.

Figure 3:
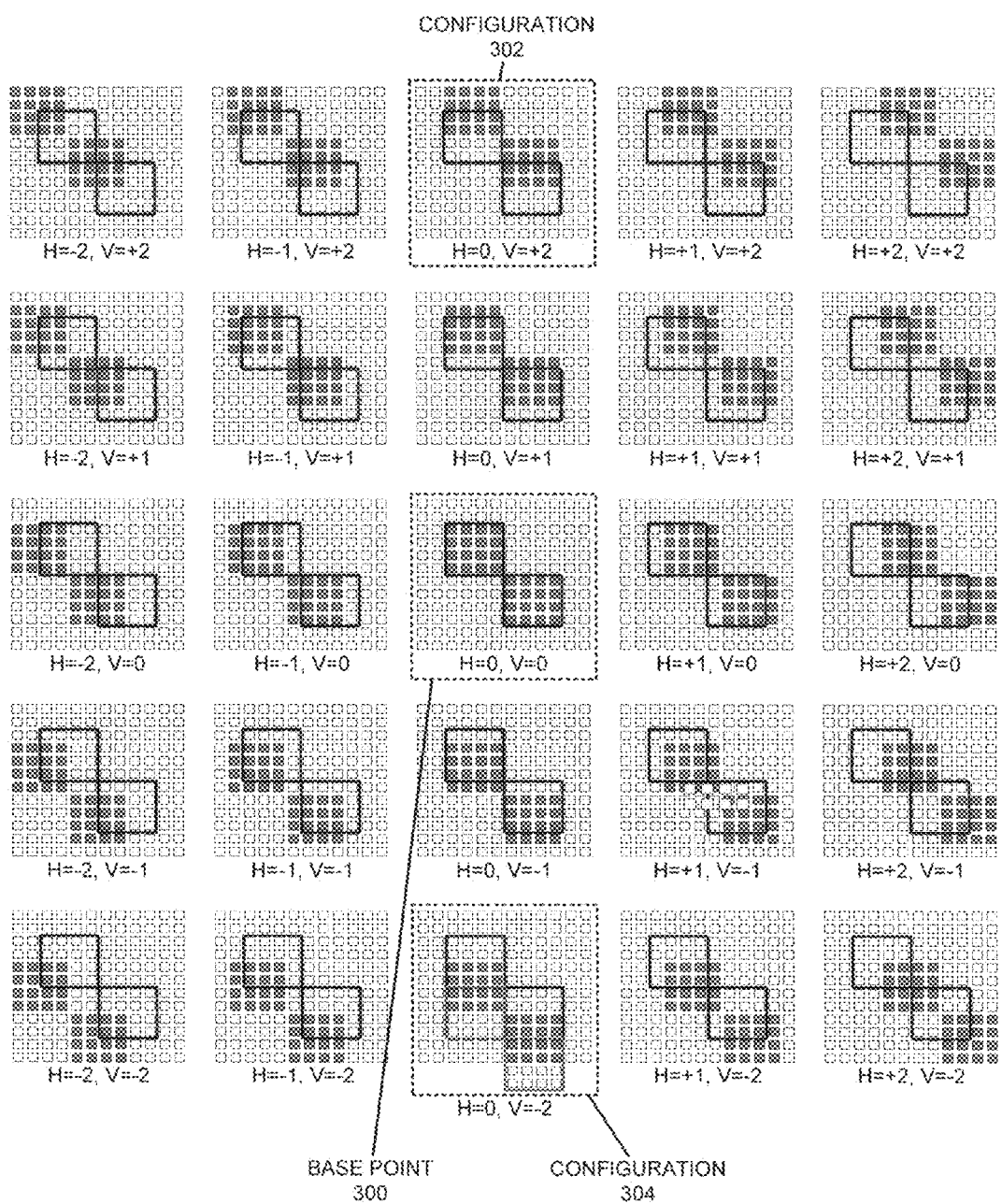
FIG. 3 illustrates the set of possible steering configurations for an exemplary 4×4 grouping of transmit micropads in accordance with an embodiment of the present invention.

FIG. 3 illustrates the set of possible steering configurations for a 4×4 grouping (N=4) of transmit micropads. More specifically, FIG. 3 shows the steering offset from the context of a base point 300 where two receiving pads are exactly aligned with transmit macropads in the steering fabric. The illustrated range of steering configurations spans a range of two full macropads, going ±2 micropads in each dimension from base point 300 in increments of one micropad, where the labels H and V denote the degree of shifting away from base point 300. Hence, FIG. 3 illustrates 25 steering configurations that cover a total of two macropad pitches in either dimension.

Note that, while the previously described steering fabric circuitry (illustrated in FIG. 2E) supports the full range of illustrated steering configurations, certain configurations are redundant. For instance, the set of signals for the activated micropads in configuration 302 where H=0 and V=+2, from the context of the two macropads highlighted in black, have the same logical configuration as the set of signals for the activated micropads in configuration 304 where H=0 and V=−2, from the context of the two macropads located south of the two macropads highlighted in black (which are shown highlighted in red in configuration 304). In other words, the local settings for the activated micropads illustrated in configuration 302 are substantially the same as the local settings for the activated micropads in configuration 304 when the macro signals used in configuration 302 are logically shifted south by one macropad (for configuration 304). Specifically, the second configuration can be achieved by permuting the data bits fed into the steering fabric circuitry at a higher level, thereby allowing some circuitry that supports this configuration from the context of the black bordered macropads to be removed. Generally, all of the H=+2 configurations (the right column of configurations in FIG. 3) are logically identical to the corresponding H=−2 configurations (the left column of configurations in FIG. 3), and all of the V=+2 configurations are logically identical to the corresponding V=−2 configurations (in the context of neighboring macropads). Hence, 9 of the 25 illustrated configurations do not need to be supported by a given macropad in a steering fabric with 4×4 macropads.

In one embodiment of the present invention, redundant steering configurations are avoided by hard-wiring some of the input signals for one column and one row of micropads in each macropad. For instance, a micropad may be hard-wired to receive only one of the two vertical column lines for the macropad illustrated in FIG. 2E, or may be hard-wired to receive both of the input signals from the two vertical column lines for the macropad (as illustrated in FIG. 2E), but no input signal from adjacent macropads. Such organizations greatly simplify the steering logic for some of the micropads, thereby providing a substantial savings in transmit power, while still allowing the data signals transmitted by the micropads to be electronically aligned to match the full range of receiving pad locations. For instance, the vertical line feeding a top row of micropads can be hard-wired to the north bit (e.g., no longer routing the south bit to the top row of micropads in the macropad), and the first column in the right half of the macropad can be hard-wired to the selected vertical ("me") bit for each given row (e.g., eliminating the "fromE" option for that column). Hard-wiring some of the input signals for the micropads allows a subset of first- and second-level multiplexers to be eliminated from the switching fabric. For instance, for an N×N pad partitioning, this technique eliminates one first-level multiplexer and N second-level multiplexers. Eliminating multiplexers effectively reduces the loading along signal paths, thereby allowing smaller drivers to be used and reducing the needed transmit power. Note that the fractional savings in power are larger for smaller values of N.

Figure 4A:
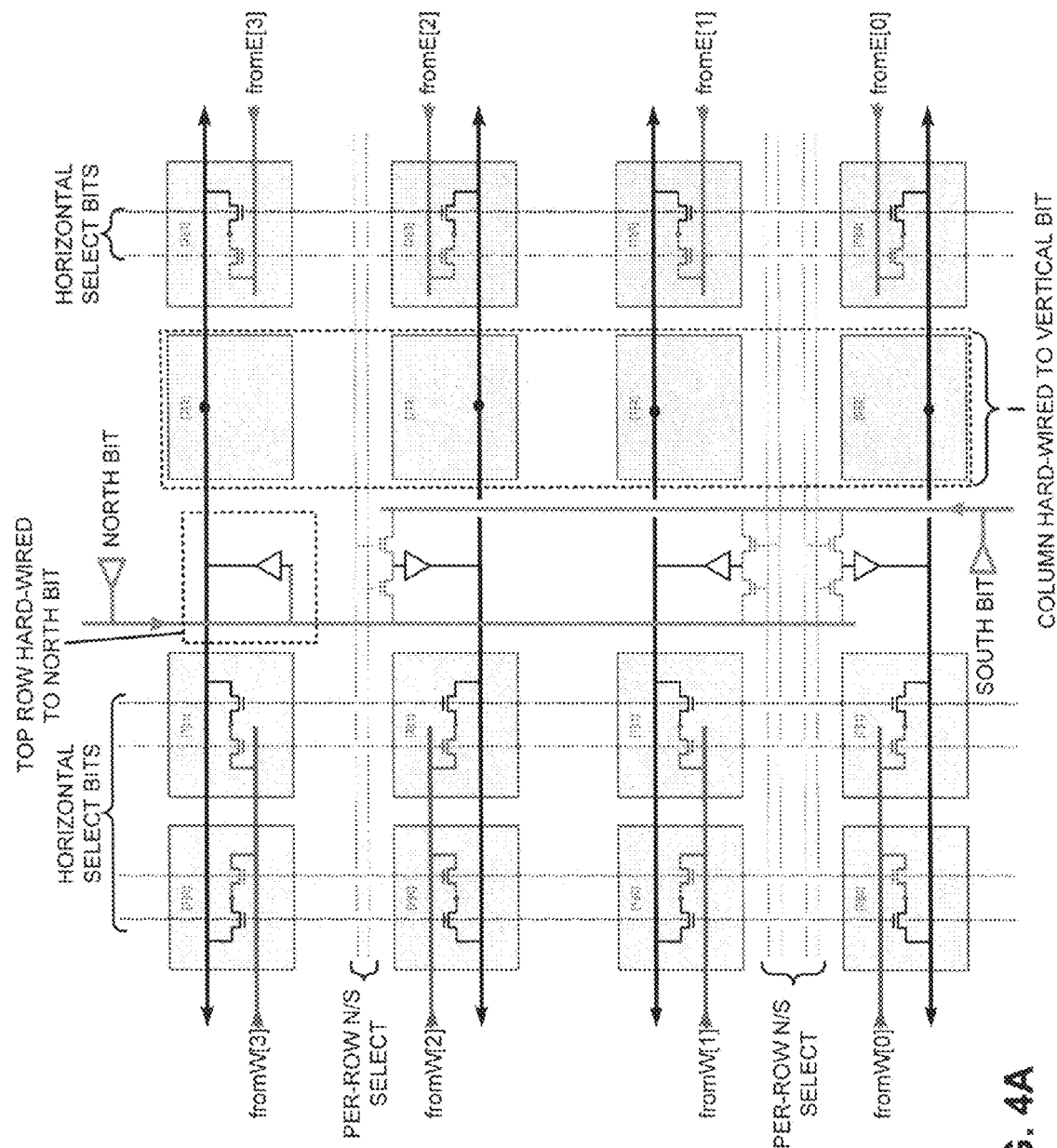
FIG. 4A illustrates exemplary steering circuitry for a 4×4 macropad in which the top row of micropads and the first column of micropads in the right half of the macropad are hard-wired to the selected vertical bit of each row in accordance with an embodiment of the present invention.
Figure 4B:
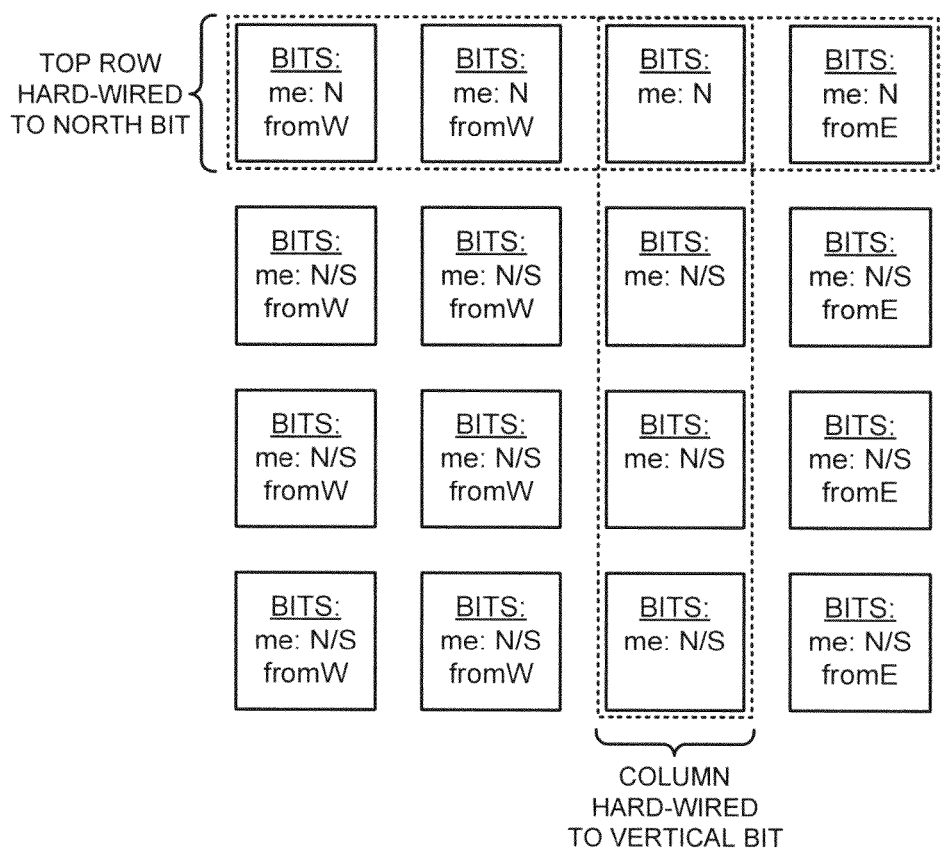
FIG. 4B illustrates a simplified view of the micropads of FIG. 4A that indicates the set of bits which can be selected for each of the micropads in accordance with an embodiment of the present invention.

FIG. 4A illustrates exemplary steering circuitry for a 4×4 macropad in which the top row of micropads is hard-wired to the north bit and the first column of micropads in the right half of the macropad is hard-wired to the selected vertical ("me"—e.g., N or S) bit of each row. FIG. 4B illustrates a simplified view of the micropads of FIG. 4A that indicates the set of bits which can be selected for each of the micropads.

For the case where N=4, the described technique eliminates one first-level multiplexer and four second-level multiplexers. For micropads sized 7×7 μm spaced 2 μm apart, the power used is reduced between 8.2 and 11.5% when the drivers are resized for substantially similar speed performance, depending on wire lengths and the physical dimensions of the transmission pad array. Note that while FIGS. 2A-4A illustrate exemplary macropads whose micropads are organized in the shape of a square, macropads are not limited to such regular shapes. Moreover, the described techniques can also be applied to the steering circuitry of differently and/or irregularly shaped macropads.

Reducing Multiplexer Power Consumption Using Thick-Oxide Transistors

The above-described steering fabric incorporates a large number of multiplexers. Reducing the power consumption and area of such multiplexers can significantly reduce the amount of power used for electronic alignment correction, thereby enhancing the feasibility of efficient, lower-power proximity communication.

Figure 5A:
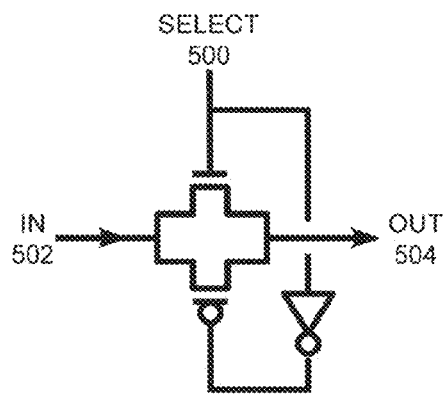
FIG. 5A illustrates a complementary pass-gate circuit in accordance with an embodiment of the present invention.
Figure 5B:
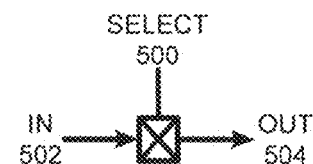
FIG. 5B illustrates a symbolic representation of a pass-gate in accordance with an embodiment of the present invention.

One common multiplexer implementation uses a parallel arrangement of NMOS and PMOS pass-gates (as shown in FIGS. 5A-5B, where FIG. 5A illustrates a complementary pass-gate circuit and FIG. 5B illustrates the symbolic representation of a pass-gate). When the select signal 500 for the multiplexer is set to HI, the pass-gate passes a signal from port 502 to out port 504. The NMOS and PMOS transistors work together to allow both HI and LO signals to be passed, with the NMOS transistor pulling down the voltage at out port 504 when a low voltage is present at in port 502 and the PMOS transistor pulling up the voltage at out port 504 when a high voltage is present at in port 502.

Figure 5C:
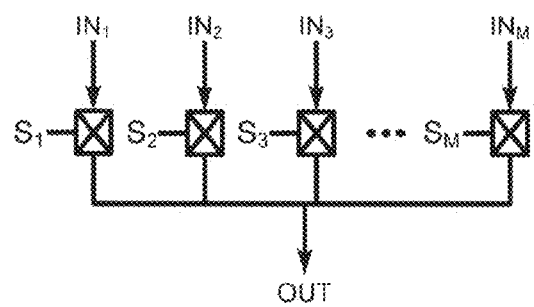
FIG. 5C illustrates an implementation of an M:1 multiplexer that uses complementary pass-gates in accordance with an embodiment of the present invention.

FIG. 5C illustrates an implementation of an M:1 multiplexer that uses complementary pass-gates. Asserting one of the select signals $\{S_1, S_2, S_3, \ldots, S_M\}$ passes the corresponding input signal to the output port. Note that the illustrated multiplexer design includes several limitations, the most notable of which is density. An M:1 multiplexer typically requires 2M transistors, assuming that a complementary select signal is already available. Because PMOS transistors are substantially slower than NMOS transistors, their widths need to be larger in order to compensate for their higher resistances. For example, in a 180 nm semiconductor process, the carrier mobility for PMOS devices is roughly three times that of NMOS devices; hence, the total size of a complementary PMOS pass-gate is roughly equivalent to that of four NMOS transistors.

Note that the PMOS transistor in a complementary pass-gate is used only to pass HI signals. A typical NMOS transistor cannot be used in place of the PMOS transistor, because an NMOS transistor will saturate when its source voltage reaches one threshold voltage ($V_{TH}$) below the gate voltage, effectively limiting the voltage passed across the source and the drain of the NMOS transistor to $V_{DD}$-$V_{TH}$ for a gate driven by a voltage of $V_{DD}$.

Many modern fabrication processes include thick-oxide NMOS transistors that can operate at voltages substantially higher than nominal supply voltages. These thick-oxide NMOS transistors have thicker layers of gate oxide that prevent gate breakdown when high voltages are applied. For example, a 1.8V 180 nm process may offer thick-oxide NMOS transistors for 3.3V operation, and a 1.0V 90 nm process may offer thick-oxide NMOS transistors for operation at 1.8V, 2.5V, and 3.3V.

One embodiment of the present invention reduces the power used by multiplexer pass-gates by replacing a PMOS transistor with a thick-oxide, high-threshold NMOS transistor. Because voltages higher than nominal $V_{DD}$ can be applied to the gate of such a thick-oxide NMOS transistor, such transistors can be used to pass a full range of nominal signal voltages.

Figure 6:
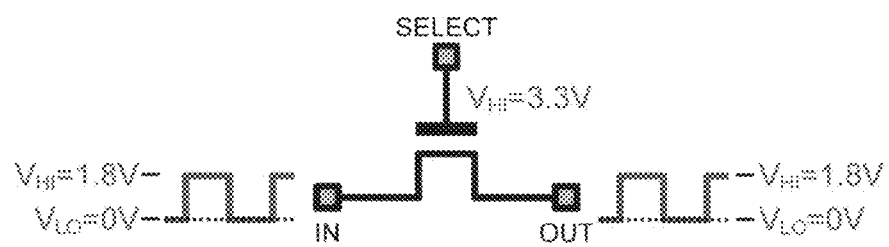
FIG. 6 illustrates an exemplary thick-oxide NMOS transistor in accordance with an embodiment of the present invention.

FIG. 6 illustrates an exemplary thick-oxide NMOS transistor in a 1.8V process that is driven at 3.3V. The threshold voltage of this transistor is around 0.7V (as compared to the threshold voltage of a typical NMOS device, which is roughly 0.45V in a 1.8V process). When a HI (3.3V) voltage is applied to the gate of the transistor, the source voltage can rise to 2.6V (e.g., 3.3V-0.7V) before the gate saturates. Because the maximum nominal signal voltage is 1.8V, the transistor can pass a full range of signal voltages without saturating. Hence, the described technique allows a single (thick-oxide) NMOS transistor to pass a full range of signal voltages, thereby eliminating the need for complementary pass-gates. Although the minimum size of a thick-oxide NMOS transistor is generally larger than that of a typical NMOS transistor, this technique can still result in savings in transistor area and power over complementary NMOS and PMOS transistors. For instance, for the previously described 4×4 macropad with micropads sized 7×7 μm and spaced 2 μm apart, the use of thick-oxide NMOS pass-gates over complementary pass-gates yields a power savings of about 21.1%.

Unfortunately, while thick-oxide NMOS transistors can be used to replace PMOS transistors, they also have several performance limitations. First, because the minimum length of a thick-oxide NMOS transistor is longer than that of a regular NMOS transistor, its resistivity is higher and its performance is generally inferior, thereby reducing area and power savings. Furthermore, the higher supply voltages needed by thick-oxide transistors often involve a separate supply voltage that needs to be distributed across the chip and/or voltage conversion circuitry that converts nominal signal levels to high-voltage levels.

Reducing Multiplexer Power Consumption Using Bootstrap Transistors

One embodiment of the present invention uses two standard NMOS transistors to pass a full range of signal voltages, with the first transistor serving as a "bootstrap transistor" for a second transistor, the "pass-gate transistor." The gate of the bootstrap transistor is tied to $V_{DD}$, the source of the bootstrap transistor is coupled to the select signal for the pass-gate, and the drain of the bootstrap transistor is connected to the gate of the pass-gate transistor. The source of the pass-gate transistor receives the input signal, while the drain of the pass-gate transistor serves as the output signal. During operation, the characteristics of the combined bootstrap transistor and pass-gate transistor facilitate passing both high-voltage and low-voltage signals across the pass-gate transistor.

Figure 7A:
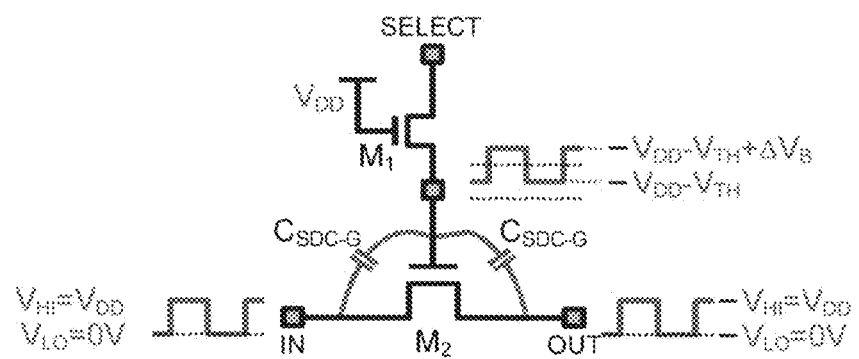
FIG. 7A illustrates a pass-gate that uses two standard NMOS transistors to pass a full range of signal voltages in accordance with an embodiment of the present invention.

FIG. 7A illustrates a pass-gate that uses two standard NMOS transistors to pass a full range of signal voltages, where $M_1$ is the bootstrap transistor and $M_2$ is the pass-gate transistor. Instead of being directly connected to the gate of the pass-gate transistor $M_2$, the select signal now passes through the bootstrap transistor ($M_1$), whose gate is tied to HI ($V_{DD}$). When the select signal is LO (0V), the gate of $M_2$ is pulled LO, turning off $M_2$ and disconnecting the output OUT from the input IN. When the select signal is HI, the voltage output to the gate of $M_2$ by $M_1$ is only ($V_{DD}$-$V_{TH}$), where $V_{TH}$ is the threshold voltage of $M_1$. Because $M_1$ is at the edge of subthreshold conduction, the gate of $M_2$ is only very weakly held. Hence, the gate of $M_2$ is semi-floating, or "bootstrapped." Note that when the input signal is LO (0V), this semi-floating voltage on the gate of $M_2$ is sufficient to pass the LO input signal to the output.

Note that coupling capacitances exist between the channel (e.g., the source and the drain) and the gate of transistor $M_2$ (indicated by the capacitances $C_{SDC-G}$ in FIG. 7A). When the input signal transitions from a LO (0V) to a HI ($V_{DD}$) voltage signal, the coupling between the channel and the gate ($C_{SDC-G}$) causes the gate of $M_2$ to rise an additional amount, $\Delta V_B$, where the value of $\Delta V_B$ depends upon the ratio of the capacitance at the gate of $M_2$ to the coupling capacitance $C_{SDC-G}$. The sizes of $M_1$ and $M_2$ can be sized such that $\Delta V_B$ is approximately 0.8 to 0.9 times the value of $V_{DD}$, so that the gate voltage of $M_2$ ($V_{DD}$-$V_{TH}$+$\Delta V_B$) is sufficiently above $V_{DD}$ (when the input is HI) to allow the NMOS transistor to pass $V_{DD}$ to the output without saturating.

Figure 7B:
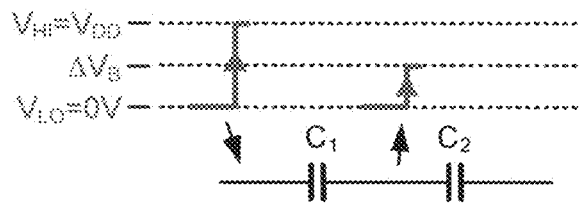
FIG. 7B illustrates the effect of a sudden voltage rise across two capacitors in series in accordance with an embodiment of the present invention.

Note that the boost of the gate voltage for $M_2$ is enabled by the weakly held intermediate voltage output by the bootstrap transistor when the select is HI. The presence of this intermediate voltage facilitates the coupling between the input and gate of $M_2$, thereby allowing the gate voltage to move synchronously with the HI data input signal. Specifically, when this data input signal quickly changes to HI, charge coupled through the capacitance to the gate node cannot be immediately discharged, causing the gate voltage for $M_2$ to temporarily increase in potential. This effect is substantially similar to the effect seen for a sudden voltage rise across two capacitors placed in series (as illustrated in FIG. 7B, where the sudden voltage rise in the circuit to the left of $C_1$ causes a corresponding (but smaller in magnitude) voltage rise for $C_2$). Note that while this additional charge eventually is discharged (e.g., by dissipating across inherent resistance or other parasitic coupling to ground or other signals), the circuit can be fabricated such that the time constant for this dissipation is sufficiently longer (e.g., lower in frequency) than the time interval for which the signal is passed such that leakage does not interfere with the passage of the high voltage signal.

The described bootstrapping technique does not require complementary pass-gates or thick-oxide transistors that require a separate power supply. By using only standard NMOS transistors, the described circuit reduces the amount of power needed to pass signals. In addition, because the gate node of the pass-gate transistor is semi-floating, its effective channel-to-gate capacitance is negligible, provided that the bootstrap transistor is small. This property reduces the parasitic capacitance seen at the input node, which allows signal drivers to be sized significantly smaller and leads to additional power savings. For instance, for the previously described 4×4 macropad with micropads sized 7×7 µm and spaced 2 µm apart, the use of bootstrapped NMOS pass-gates over complementary pass-gates yields a power savings of about 21.5%.

Note that because the gate voltage of the pass-gate transistor changes correspondingly with the input signal, gate oxide breakdown is not an issue. Specifically, the gate voltage for $M_2$ is only above $V_{DD}$ when the channel voltage is also HI. Hence, the voltage difference between the gate and the channel is always less than $V_{DD}$.

Figure 8:
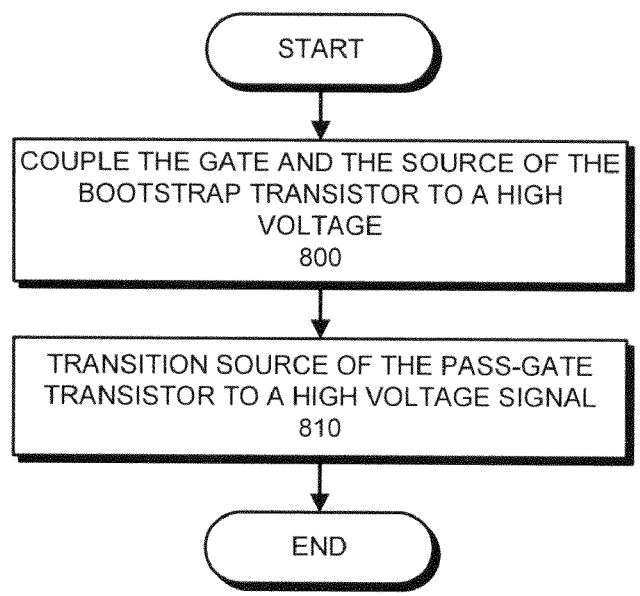
FIG. 8 presents a flow chart illustrating a process that facilitates proximity communication by allowing a high voltage signal to be passed across two standard NMOS gates in accordance with an embodiment of the present invention.

FIG. 8 presents a flow chart illustrating a process that facilitates proximity communication by allowing a high voltage signal to be passed across two standard NMOS gates. This process occurs for a computing device that includes a circuit with a bootstrap transistor and a pass-gate transistor, where: the drain of the bootstrap transistor is coupled to the gate of the pass-gate transistor; a first coupling capacitance exists between the source of the pass-gate transistor and the drain of the bootstrap transistor; and a second coupling capacitance exists between the drain of the pass-gate transistor and the drain of the bootstrap transistor. During operation, the gate and the source of the bootstrap transistor is coupled to a high voltage (operation 800). Subsequently, the source of the pass-gate transistor is transitioned to a high voltage signal (operation 810). This transition, in combination with the two coupling capacitances and a floating voltage generated by the bootstrap transistor, boosts the voltage at the gate of the pass-gate transistor higher than the high voltage signal, thereby enabling the high voltage signal to pass from the source to the drain of the pass-gate transistor.

In summary, bootstrapped NMOS pass-gates can be used to create an intermediate voltage that can be boosted above $V_{DD}$ in the presence of a high signal voltage, thereby allowing $V_{DD}$ to be passed through a pass-gate transistor without requiring a separate (higher) supply voltage and/or complex voltage conversion circuitry.

Using Floating Fill Metal to Lower Pad Capacitance

Most integrated circuit (IC) foundries stipulate minimum metal density rules which require that a minimum percentage, typically about 30%, of each metal layer in an IC be filled. These rules prevent the over-etching and pinching of isolated wires (also known as "microloading") due to prolonged etching times that are required to etch away metal in areas of low density. Typically, such minimum metal density rules are enforced over a window of a specified size, and therefore large cell blocks need to maintain minimum metal density by adding dummy metal structures (referred to as "fill" or "filler cells") in empty areas. Often such fill metal is tied to $V_{DD}$ or ground to facilitate power distribution across a semiconductor chip.

Unfortunately, fill metal in power grids can significantly increase the parasitic capacitances of wires in a circuit. In proximity communication circuits, the proximity input/output (I/O) pads are often drawn in the top-level metal layer, and fill metal is usually added in all metal layers below to meet minimum density rules. This organization can greatly increase the capacitance of proximity I/O pads, whose surface area is large in comparison to their thickness, because the pad capacitance is dominated by capacitance to signal or fill metal in lower metal layers. Overcoming this additional pad capacitance often requires increasing the size of signal drivers to drive larger pad loads, which requires higher transmit power.

Figure 9A:
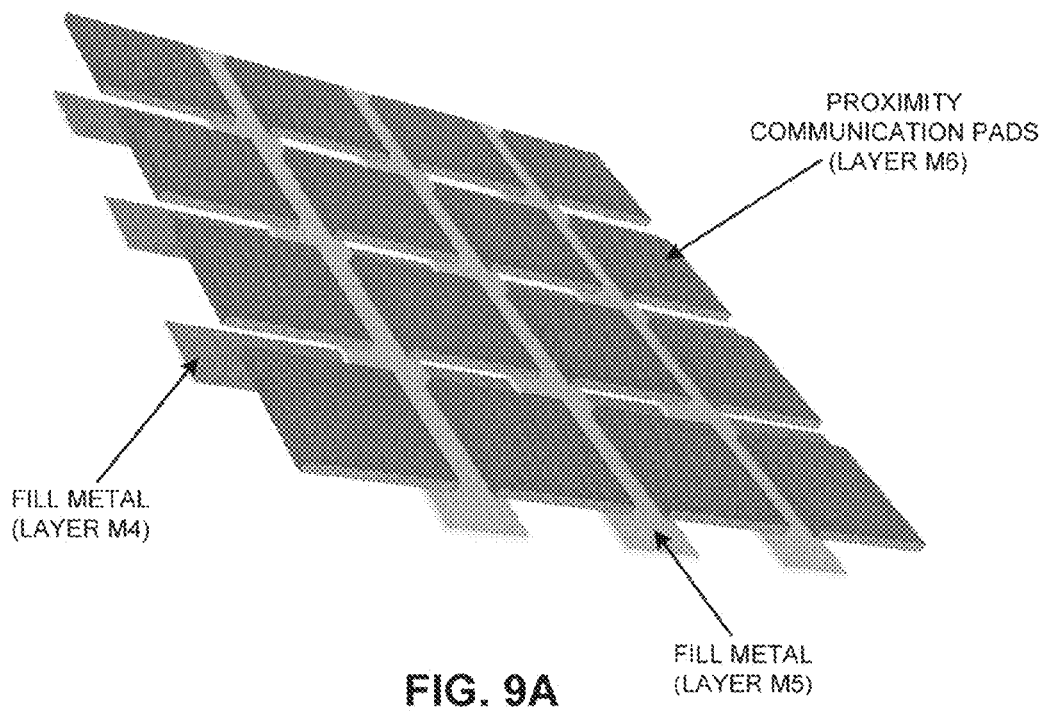
FIG. 9A illustrates lowering the capacitive loading of proximity communication pads by placing floating fill metal directly below gaps between the proximity communication pads in accordance with an embodiment of the present invention.

One embodiment of the present invention lowers the capacitive loading of proximity I/O pads by placing floating fill metal directly below gaps between the proximity I/O pads (as shown in FIG. 9A). Placing fill metal between gaps reduces the coupling area between the pads and the fill metal. Furthermore, allowing the fill metal to float (e.g., by not connecting the fill metal to any voltage) further reduces the pad capacitance to the point where the remaining pad capacitance is primarily the coupling capacitance with the fill metal in series with the coupling capacitance between the fill metal and all other surrounding metal.

Figure 9B:
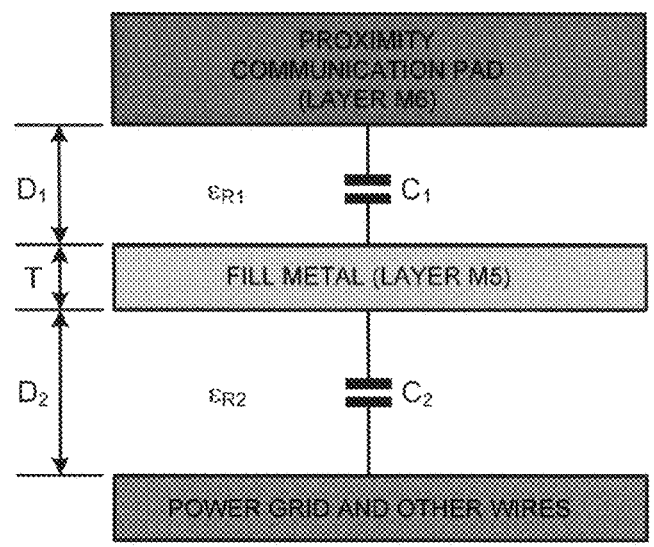
FIG. 9B illustrates the capacitance seen by a proximity communication pad in accordance with an embodiment of the present invention.

FIG. 9B illustrates the capacitance seen by a proximity I/O pad. For the illustrated metal structure, when the fill metal in layer M5 is tied to a fixed voltage, the pad capacitance is approximately:

$$C_1 = \frac{\varepsilon_{R1}\varepsilon_0 A}{D_1},$$

where A is the coupling area, $\varepsilon_{R1}$ is the dielectric constant of the material between layers M5 and M6, $\varepsilon_0$ is the permittivity of free space, and $D_1$ is the distance between layers M5 and M6, and assuming negligible coupling to adjacent pads. If the fill metal is floating, however, the pad capacitance effectively becomes the series combination of $C_1$ and $C_2$, where $C_2$ represents the coupling capacitance between the fill metal and all other surrounding wires. This series capacitance is given by $$C_{pad} = \frac{\varepsilon_{R1}\varepsilon_{R2}\varepsilon_0 A}{\varepsilon_{R1}D_2 + \varepsilon_{R2}D_1},$$

which, for the case where $\varepsilon_{R2} = \varepsilon_{R1} = \varepsilon_R$, reduces to $$C_{pad} = \frac{\varepsilon_R \varepsilon_0 A}{D_1 + D_2},$$

which is lower than $C_1$.

In an exemplary 0.18 µm 1P6M process (which includes six metal layers), $D_1 = 0.8$ µm and $D_2 = 1.33$ µm (to metal layer M4), assuming a ground plane in layer M4. In this scenario, about 65% of the pad capacitance is capacitance to metal layer M5, and the described technique can reduce the pad capacitance by up to 41.6%.

In one embodiment of the present invention, floating fill metal is partitioned into multiple smaller pieces, so that each piece of fill metal does not straddle areas below two adjacent micropads. Partitioning the fill metal prevents coupling of a differing signal at the boundaries of different logical macropads, thereby eliminating increased capacitances due to the Miller effect.

Figure 9C:
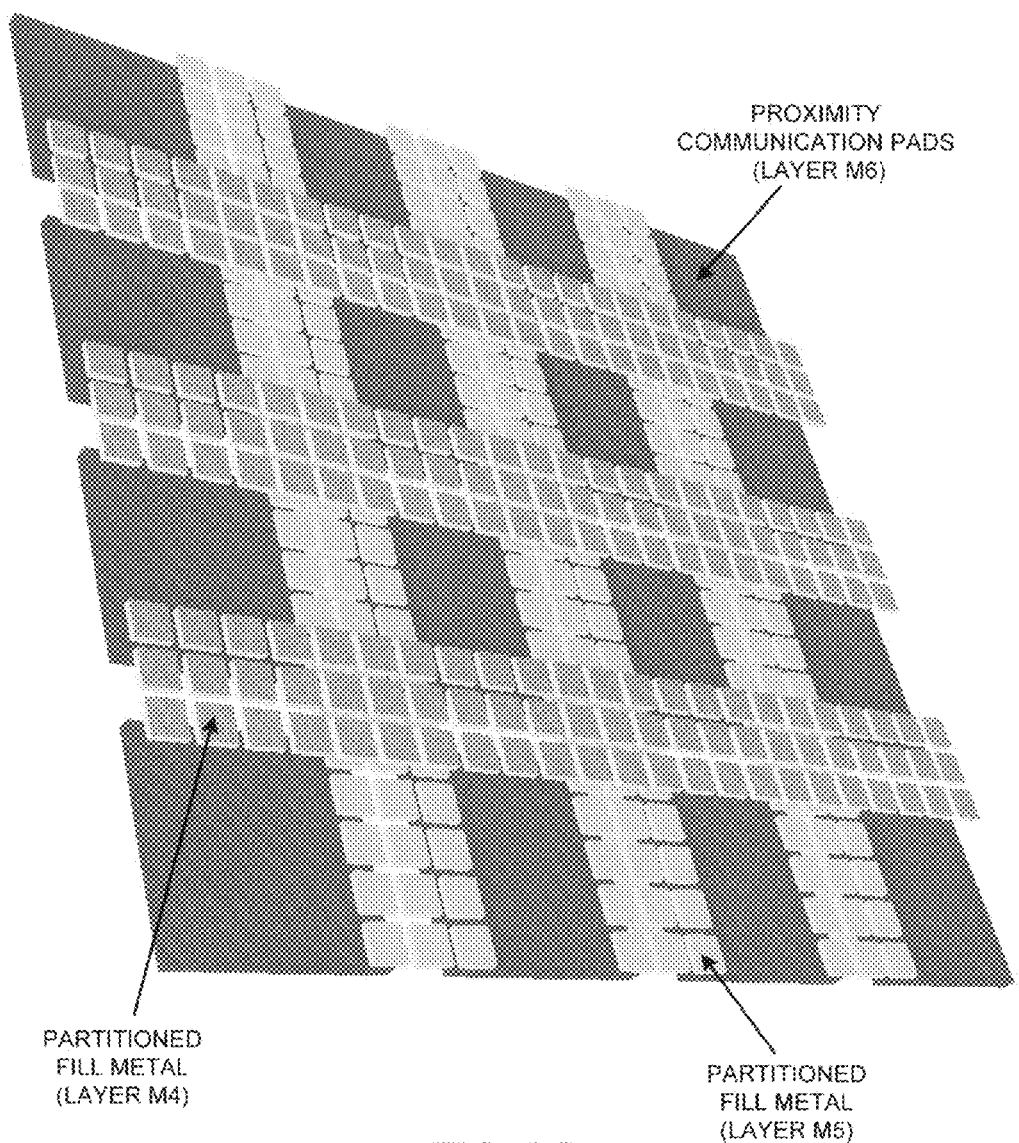
FIG. 9C illustrates a back-side view of a 4×4 macropad cell with partitioned floating metal layers in accordance with an embodiment of the present invention.

FIG. 9C illustrates a back-side view of a 4×4 macropad cell with partitioned floating M5 and M4 layers.

Routing Signals Over Areas with Probabilistically Favorable Coupling

Different micropads in a given (physical) transmit macropad cell typically have different probabilities of being driven to different signals. For the macropad cell illustrated in FIG. 2E, each micropad can be connected to a data signal from one of three sources: the north bit (me: N), the south bit (me: S), or a data signal from a neighboring macropad cell (fromW or fromE, each of which may also have two sources). By considering all of the possible horizontal and vertical shifts, one can calculate the probability with which each micropad will be steered to each of the three data sources.

FIG. 10A illustrates the computed routing probabilities for the 4×4 micropad array structure illustrated in FIG. 2E, assuming that the selection probability of each of the 25 possible shifts (illustrated in FIG. 3) is equal.

FIG. 10B illustrates the computed routing probabilities for the more power-optimal micropad array illustrated in FIG. 4A, where some of the data signals in the top row and the third column are hard-wired. The values in FIG. 10B illustrate how certain rows and columns of the micropad cells (from FIG. 4A) are much more likely to be steered toward one of the three data sources. For example, the column 3 micropads have average probabilities of 62.5% and 37.5% of being steered to the north (N) and south (S) bits, respectively. On the other hand, the column 1 micropads has average probabilities of 31.25% and 18.75% of being steered to the north (N) and south (S) bits, respectively. Therefore, the third column has twice the probability of being driven to the north or south bits (N or S), compared to the first column.

One embodiment of the present invention routes data wires over areas with probabilistically favorable coupling to exploit the distribution of steering probabilities, thereby lowering power consumption. For example, because the third column of micropads in FIG. 10B has a much higher probability of being driven to the north bit (N) compared to other columns, the data wire for this (N) data signal can be routed over this column. When the third column is selected to be driven to the north bit (N), all of the wires in the micropad cell toggle in the same way, which significantly reduces the effective capacitance of the data wire under the column. For symmetry, the data wire for the south bit (S) can be routed over the second column, which has the second-highest probability (28.125%, on average) of being driven to this (S) data signal.

Note that this technique saves power without requiring any additional circuit complexity, separate supply voltages, or circuit components. For the case of the 4×4 micropad array illustrated in FIG. 4A, this technique can provide a savings of up to 62.5% of the wire energy for the north data wire, and 18.7% for the south data wire. Note that the savings are significantly less for the south data wire because the first row is hard-wired to the north data wire, which skews the probability distribution favorably toward the north bit.

Checkerboard Micropad Arrays

One embodiment of the present invention uses checkerboard micropad arrays to reduce transmit power. A checkerboard micropad array structure uses half the number of micropads and half the number of second-level multiplexers, and can therefore offer significant power savings. However, a checkerboard micropad array also provides less coupling capacitance for signal transmission, and hence typically involves careful consideration of the tradeoff between coupling degradation and power reduction. A net benefit can be realized when the potential power savings is greater than the reduction in coupling capacitance.

Figure 11:
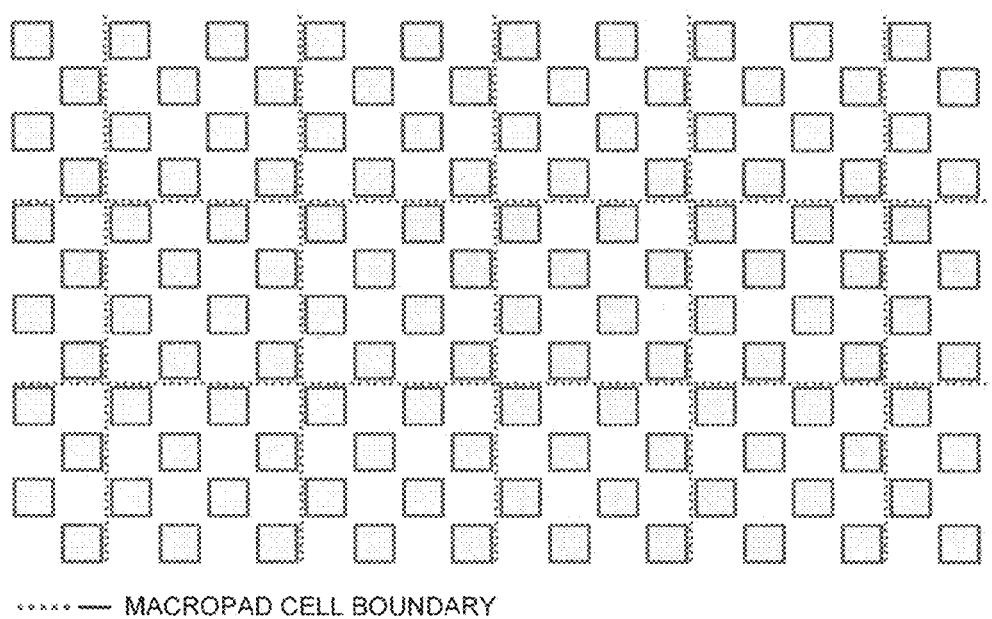
FIG. 11 illustrates a checkerboard micropad array in accordance with an embodiment of the present invention.

FIG. 11 illustrates a checkerboard micropad array. The illustrated checkerboard micropad array uses half the number of micropads of a fully-populated micropad array (illustrated in FIG. 1B), instead containing a micropad only at every other location, both horizontally and vertically.

Figure 12:
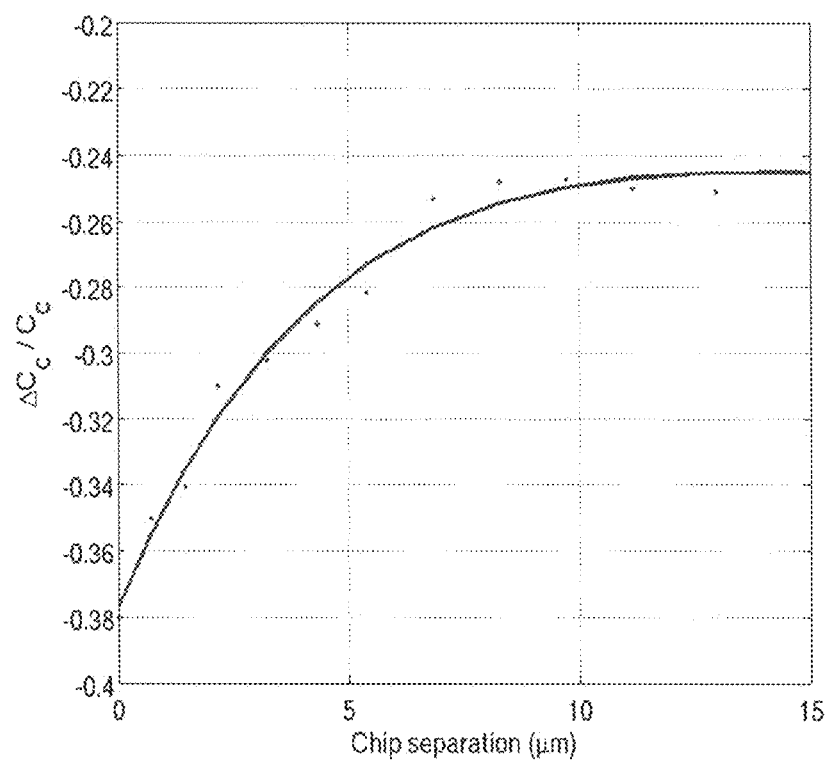
FIG. 12 illustrates how the coupling capacitance of a checkerboard array compares to that of a fully populated micropad array for a range of chip separation distances in accordance with an embodiment of the present invention.
Figure 13A:
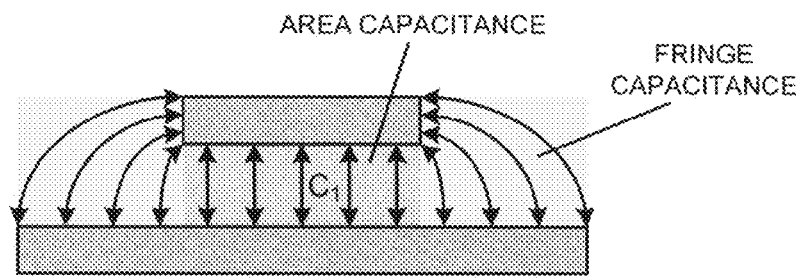
FIG. 13A illustrates area and fringe capacitance in accordance with an embodiment of the present invention.
Figure 13B:
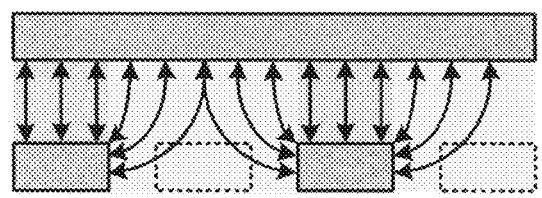
FIG. 13B illustrates the presence of fringe capacitance for areas in a checkerboard array that would otherwise have been occupied by micropads (in a fully-populated transmit array) in accordance with an embodiment of the present invention.

FIG. 12 illustrates how the coupling capacitance, Cc, of a checkerboard array compares to that of a fully populated micropad array for a range of chip separation distances. These results are obtained from three-dimensional field-solver simulations of a 4×4 array of micropads sized 7×7 µm and spaced 2 µm apart. Note that the reduction in coupling capacitance is less than 50%, even though the checkerboard array includes only half of the standard number of micropads. This fractional reduction occurs because coupling capacitance includes both area coupling and fringe coupling. As illustrated in FIG. 13A, area capacitance (and area coupling) is generally proportional to the coupling area, while fringe capacitance (and fringe coupling) mostly occurs along the perimeter of the pad. For a fully populated micropad array, the coupling capacitance is dominated by area coupling, because almost the entire receiving pad area is exposed to transmit micropads, and the sides of the micropads couple mostly to adjacent micropads. With a checkerboard array, while area coupling reduces significantly, this reduction is somewhat mitigated by fringe coupling along the sides of the micropads, where adjacent micropads are now absent (as illustrated in FIG. 13B).

Note that the relative reduction in coupling capacitance is lower at larger chip separations. This is due to the fact that fringe coupling decreases with distance Z as $\sim\log(1+t/Z)$ (where t is thickness of the metal), while area coupling decreases much more quickly with distance as ($\sim 1/Z$). The lower relative reduction of coupling capacitance at large chip separations therefore confirms the existence of a large fringe component in the coupling capacitance for the checkerboard layout.

Figure 13C:
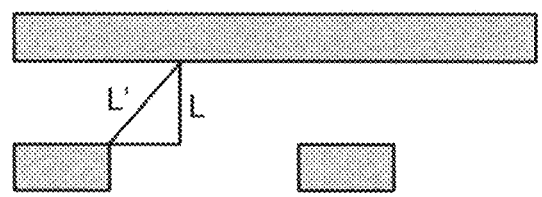
FIG. 13C illustrates fringe and area coupling effects for two proximity communication pads in close proximity in accordance with an embodiment of the present invention.
Figure 13D:
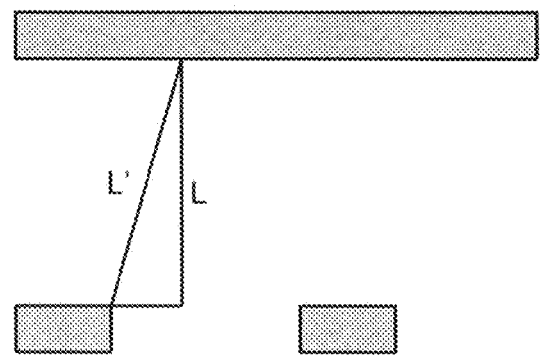
FIG. 13D illustrates fringe and area coupling effects for two proximity communication pads as the distance between the two proximity communication pads increases in accordance with an embodiment of the present invention.

FIGS. 13C-13D illustrate the effect on the relative distance over which coupling occurs when the distance between two proximity communication pads is increased. In FIG. 13C, the two pads are close together, and the coupling distance (L') for fringe coupling is considerably larger than the coupling distance (L) for area coupling, resulting in a larger overall reduction in coupling capacitance (when removing micropads). As the distance between the two pads is increased, however (see FIG. 13D), L' approaches L, and the coupling due to fringe capacitance approaches that of area coupling, thereby decreasing the reduction in coupling capacitance (due to removed micropads).

In comparison with a fully populated micropad array, the above-described checkerboard micropad array uses only half the number of micropads and half the number of second-level multiplexers. For an N×N array, this technique saves $N^2/2$ micropads and $N^2/2$ second-level multiplexers. Hence, the savings in power and circuit complexity is much higher for large values of N. For N=4, the savings in power is approximately 40.4%. While this is comparable to the reduction in coupling capacitance at zero chip separation, in practical applications chip separations range between 3 to 10 µm. In this regime, the reduction in coupling capacitance is about 25 to 30% compared to a fully populated micropad array; the savings in power therefore outweighs the reduction in coupling capacitance.

Figure 14:
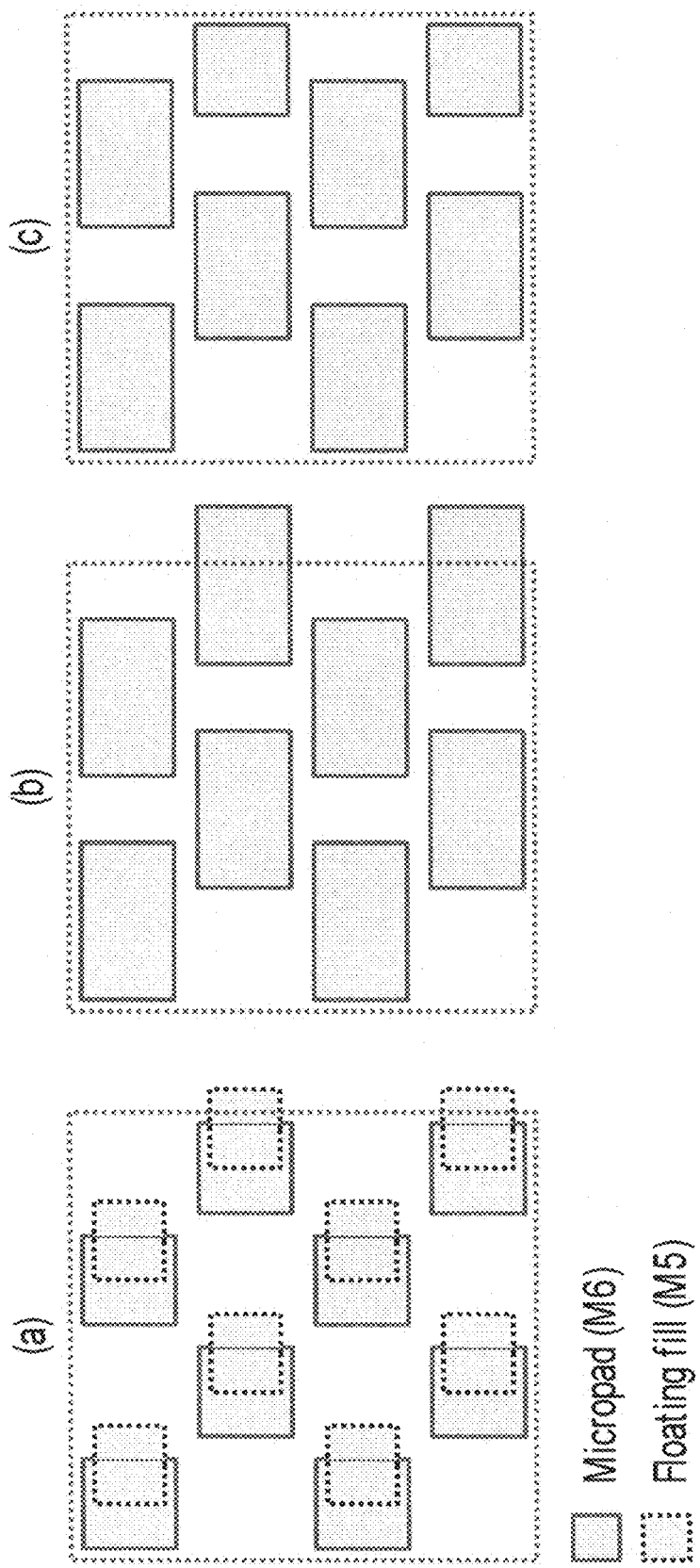
FIG. 14 illustrates three alternative arrangements for checkerboard micropad arrays in accordance with an embodiment of the present invention.

FIG. 14 illustrates three alternative arrangements for checkerboard micropad arrays. Arrangement (a) illustrates a checkerboard micropad array that includes floating fill metal below each micropad. This floating fill may be offset in position from the micropad in one of the two dimensions (as shown), or both dimensions (not shown). In this arrangement, a signal driven onto a micropad couples to the fill metal, which in turn couples to the receiving pad on the receiving chip, thereby enhancing signal coupling. Arrangement (b) illustrates a checkerboard micropad array with elongated micropads. This arrangement also enhances signal coupling; although the capacitance of each micropad is higher, the reduced micropad count still provides an $N^2/2$ reduction in the number of second-level multiplexers.

Note that in both arrangements (a) and (b) of FIG. 14 the floating fill and/or elongated pad extensions may couple the signal onto an adjacent receiving pad, which can introduce crosstalk noise. Arrangement (c) in FIG. 14 illustrates a checkerboard micropad array where some micropads do not have extensions. This arrangement mitigates the introduction of crosstalk when steering is at the nominal horizontal configuration.

Computing Environment

In some embodiments of the present invention, proximity communication can be incorporated into a wide range of computing devices. For instance, proximity communication may be used to facilitate communication between two integrated circuits in: a microprocessor system; a mainframe or server computer; a digital signal processing device; a portable computing device, such as a mobile telephone or other communications device; a network switch; a computational engine within an appliance; a personal organizer; and/or a device controller.

Figure 15:
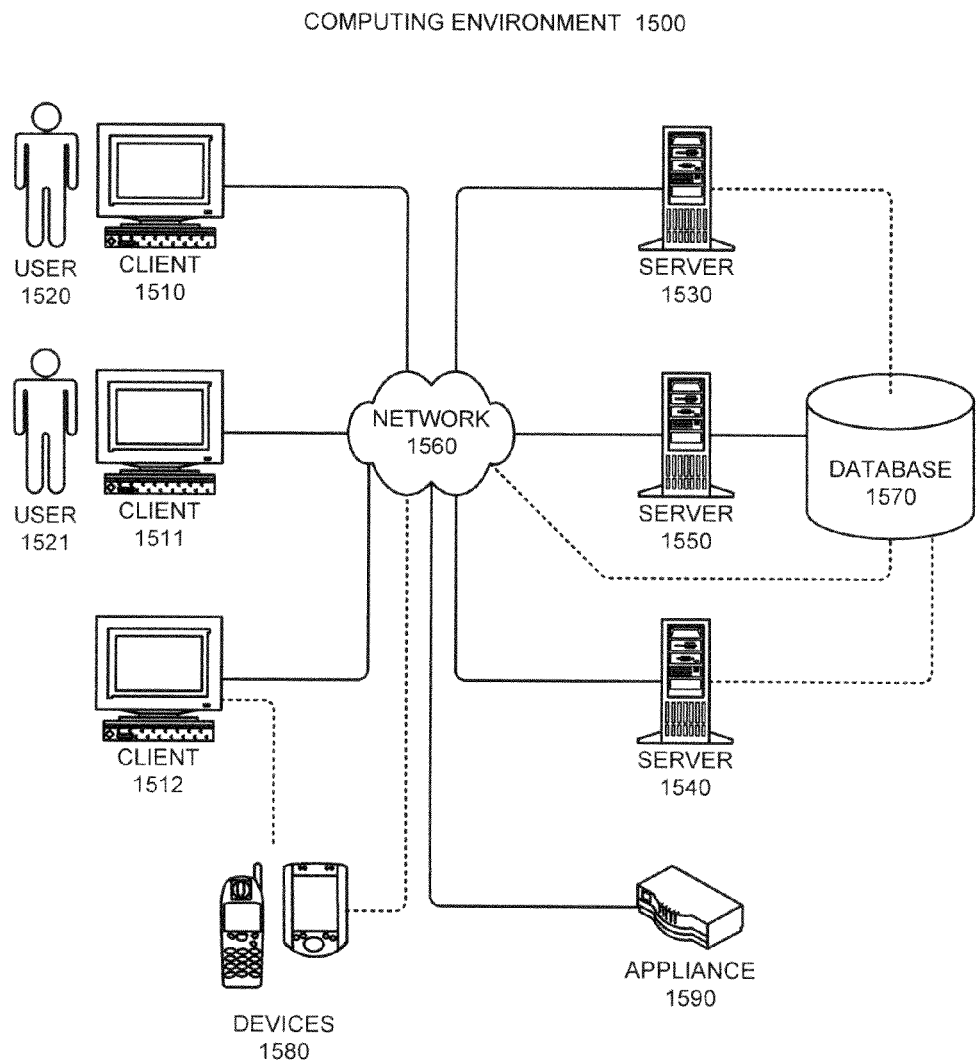
FIG. 15 illustrates computing devices and a computing environment that can be used in an embodiment of the present invention.

FIG. 15 illustrates a computing environment 1500 in accordance with an embodiment of the present invention. Computing environment 1500 includes a number of computer systems, which can generally include any type of computer system based on a microprocessor, a mainframe computer, a digital signal processor, a portable computing device, a personal organizer, a device controller, or a computational engine within an appliance. More specifically, referring to FIG. 15, computing environment 1500 includes clients 1510-1512, users 1520 and 1521, servers 1530-1550, network 1560, database 1570, devices 1580, and appliance 1590. Any of the devices illustrated in FIG. 15 may include integrated circuits that communicate using proximity communication.

Clients 1510-1512 can include any node on a network including computational capability and including a mechanism for communicating across the network. Additionally, clients 1510-1512 may comprise a tier in an n-tier application architecture, wherein clients 1510-1512 perform as servers (servicing requests from lower tiers or users), and wherein clients 1510-1512 perform as clients (forwarding the requests to a higher tier).

Similarly, servers 1530-1550 can generally include any node on a network including a mechanism for servicing requests from a client for computational and/or data storage resources. Servers 1530-1550 can participate in an advanced computing cluster, or can act as stand-alone servers. In one embodiment of the present invention, server 1540 is an online "hot spare" of server 1550.

Users 1520 and 1521 can include: an individual; a group of individuals; an organization; a group of organizations; a computing system; a group of computing systems; or any other entity that can interact with computing environment 1500.

Network 1560 can include any type of wired or wireless communication channel capable of coupling together computing nodes. This includes, but is not limited to, a local area network, a wide area network, or a combination of networks.

In one embodiment of the present invention, network 1560 includes the Internet. In some embodiments of the present invention, network 1560 includes phone and cellular phone networks.

Database 1570 can include any type of system for storing data in non-volatile storage. This includes, but is not limited to, systems based upon magnetic, optical, or magneto-optical storage devices, as well as storage devices based on flash memory and/or battery-backed up memory. Note that database 1570 can be coupled: to a server (such as server 1550), to a client, or directly to a network. In some embodiments of the present invention, database 1570 is used to store information related to virtual machines and/or guest programs. Alternatively, other entities in computing environment 1500 may also store such data (e.g., servers 1530-1550).

Devices 1580 can include any type of electronic device that can be coupled to a client, such as client 1512. This includes, but is not limited to, cell phones, personal digital assistants (PDAs), smart-phones, personal music players (such as MP3 players), gaming systems, digital cameras, portable storage media, or any other device that can be coupled to the client. Note that in some embodiments of the present invention, devices 1580 can be coupled directly to network 1560 and can function in the same manner as clients 1510-1512.

Appliance 1590 can include any type of appliance that can be coupled to network 1560. This includes, but is not limited to, routers, switches, load balancers, network accelerators, and specialty processors. Appliance 1590 may act as a gateway, a proxy, or a translator between server 1540 and network 1560.

Note that different embodiments of the present invention may use proximity communication in different system configurations, and are not limited to the system configuration illustrated in computing environment 1500. In general, any device that includes multiple integrated circuits that need to communicate with each other may incorporate elements of the present invention.

Figure 16:
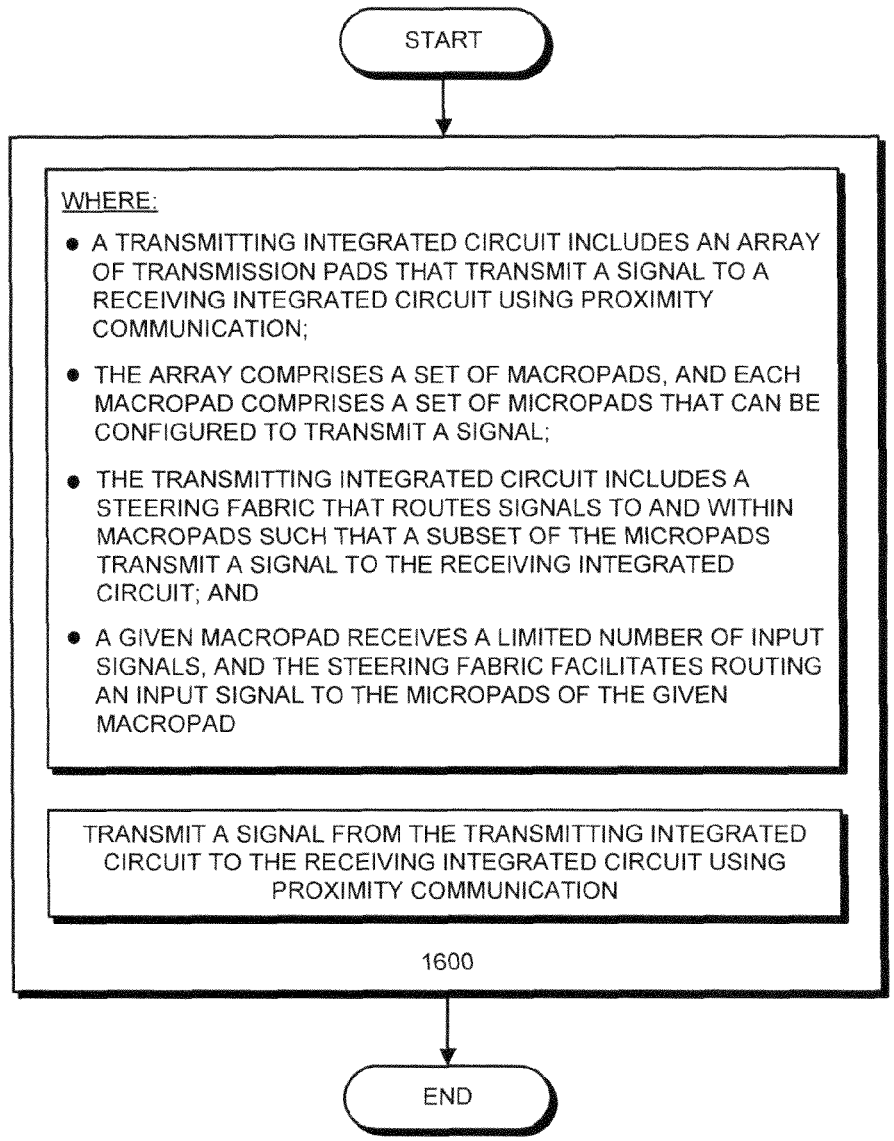
FIG. 16 presents a flow chart illustrating a method that facilitates reducing the amount of power needed to transmit a signal via proximity communication in one embodiment of the present invention.

FIG. 16 presents a flow chart illustrating a method that facilitates reducing the amount of power needed to transmit a signal via proximity communication in one embodiment of the present invention. This method is executed in an environment where a transmitting integrated circuit includes an array of transmission pads that transmit a signal to a receiving integrated circuit using proximity communication. This array comprises a set of macropads, where each macropad comprises a set of micropads that can be configured to transmit a signal. The transmitting integrated circuit also includes a steering fabric that routes signals to and within macropads such that a subset of the micropads can be configured to transmit a signal to the receiving integrated circuit, and a given macropad receives a limited number of input signals. The steering fabric facilitates routing an input signal to the micropads of the given macropad. During operation, the transmitting integrated circuit transmits a signal to the receiving integrated circuit using proximity communication (operation 1600). Note that transmitting the signal using a steering fabric that limits the number of input signals that are routed to a micropad in the given macropad facilitates eliminating redundant steering configurations for the array and reducing the power needed to transmit the signal.

Figure 17:
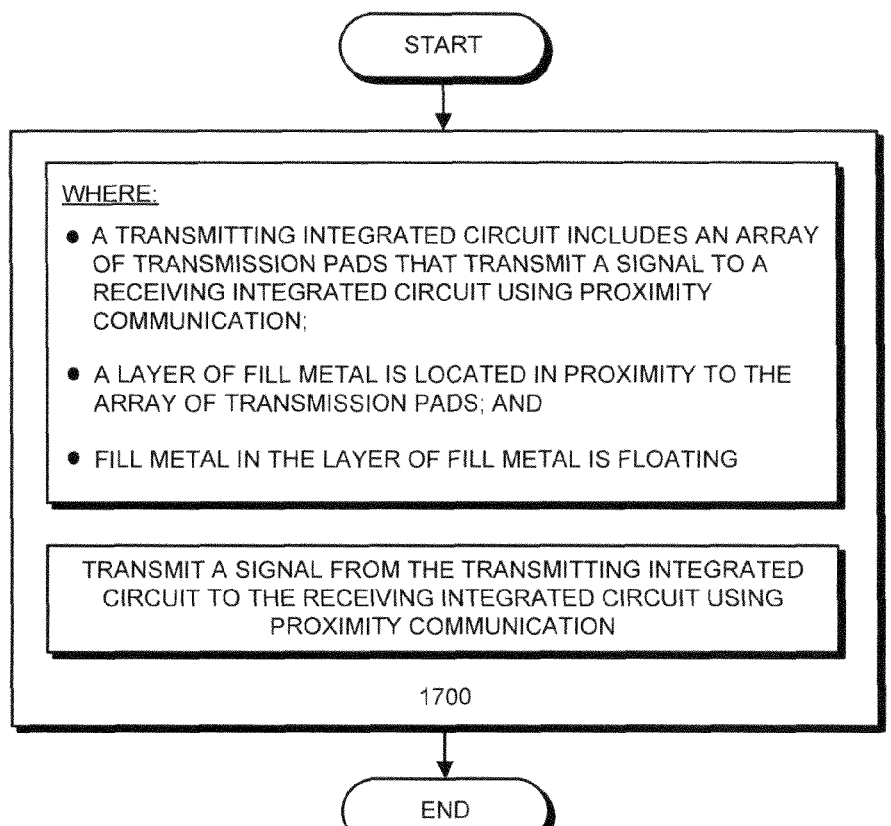
FIG. 17 presents a flow chart illustrating a second method that facilitates reducing the amount of power needed to transmit a signal via proximity communication in one embodiment of the present invention.

FIG. 17 presents a flow chart illustrating a method that facilitates reducing the amount of power needed to transmit a signal via proximity communication in one embodiment of the present invention. This method is executed in an environment where: a transmitting integrated circuit includes an array of transmission pads that transmit a signal to a receiving integrated circuit using proximity communication; a layer of fill metal is located in proximity to the array of transmission pads; and fill metal in this layer of fill metal is floating. During operation, the transmitting integrated circuit transmits a signal to the receiving integrated circuit using proximity communication (operation 1700). Note that transmitting signals in proximity to the layer of floating fill metal reduces parasitic capacitance for the array of transmission pads and thereby facilitates reducing the amount of power needed to transmit the signal.

In summary, embodiments of the present invention reduce the power consumed for electronic alignment correction in proximity communication circuits by:

hard-wiring columns and/or rows of micropads in the steering fabric;

using thick-oxide NMOS transistor pass-gates in the steering fabric;

using bootstrapped NMOS transistor pass-gates in the steering fabric;

using floating fill-metal to reduce parasitic pad capacitance;

routing signals over areas with probabilistically favorable coupling; and/or using a checkerboard micropad array.

The described techniques facilitate increasing the voltage swing across a transmit pad for a given amount of power, thereby improving the signal detected by a receiving circuit and improving the efficiency and range of proximity communication.

In some embodiments of the invention, aspects of the described techniques can also be used in a receiving component. For instance, floating fill metal may be used to reduce parasitic pad capacitance for the receiving pads of the receiving component, thereby allowing the receiving pads to receive a signal that is transmitted correctly.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A transmit fabric that facilitates proximity communication, comprising:
    an array of transmission pads that transmit signals using proximity communication, wherein the array comprises a set of macropads, wherein each macropad comprises a set of two or more micropads that can be configured to transmit one or more signals;
    a steering fabric that routes signals to and within a given macropad such that a transmitting subset of the micropads in the given macropad transmits a signal to a receiving component, wherein the steering fabric routes a first direct input signal and a second direct input signal to the given macropad;
    a first level of steering logic in the steering fabric that selectively routes at least one of the first direct input signal and the second direct input signal to each of the micropads in the given macropad; and
    a second level of steering logic in the steering fabric that routes one of a direct input signal for the macropad or a direct input signal from an adjacent macropad to a micropad in the given macropad; and
    wherein the steering fabric limits the number of input signals that are routed to the micropad in the given macropad to eliminate redundant steering configurations for the array and to reduce the power needed to transmit the signal.

2. The transmit fabric of claim 1,
    wherein the limited number of input signals received by the given macropad is less than the number of micropads in the given macropad; and
    wherein some of the input signals are routed to a limited set of micropads in the given macropad.

3. The transmit fabric of claim 1, wherein one or more micropads for the given macropad are coupled to two or fewer of the input signals for the macropad.

4. The transmit fabric of claim 3,
    wherein multiplexers in the first level and the second level steering logic route the first and second direct input signals and the direct input signal from the adjacent macropad to a first set of one or more micropads in the given macropad;
    wherein multiplexers in the first level and the second level steering logic route the first input signal and the direct input signal from the adjacent macropad to a second set of one or more micropads in the given macropad;
    wherein multiplexers in the first level steering logic route the first input signal to a third set of one or more micropads in the given macropad;
    wherein the first set, the second set, and the third set of micropads are distinct.

5. The transmit fabric of claim 4,
    wherein the micropads in the given macropad are organized as a rectangular grid; and
    wherein at least one of a row and a column of micropads in the given macropad are limited to receive two or fewer input signals.

6. The transmit fabric of claim 1, wherein the steering fabric facilitates electronic alignment techniques that use a set of micropads that span multiple macropads to transmit the signal to the receiving component using proximity communication.

7. The transmit fabric of claim 1, wherein a redundant steering configuration occurs when multiple different sets of input values for the steering fabric result in the same configuration of transmit values for the array.

8. The transmit fabric of claim 1,
    wherein a fourth set of micropads in the given macropad have a higher probability of being driven by the first direct input signal during electronic alignment; and
    wherein a signal line carrying the first direct input signal is routed in proximity to one or more micropads in the fourth set to reduce the parasitic capacitance between the signal line and the micropads of the macropad.

9. The transmit fabric of claim 1, wherein the layout of the steering fabric for the given macropad is replicated across some or all of the macropads in the array of transmission pads.

10. A computing device, comprising:
    a transmitting integrated circuit that facilitates proximity communication; and
    a receiving integrated circuit;
    wherein the transmitting integrated circuit includes:
        an array of transmission pads that transmit signals using proximity communication, wherein the array comprises a set of macropads, wherein each macropad comprises a set of two or more micropads that can be configured to transmit one or more signals;
        a steering fabric that routes signals to and within a given macropad such that a transmitting subset of the micropads in the given macropad transmits a signal to a receiving component on the receiving integrated circuit, wherein the steering fabric routes a first direct input signal and a second direct input signal to the given macropad;
a first level of steering logic in the steering fabric that selectively routes at least one of the first direct input signal and the second direct input signal to each of the micropads in the given macropad; and
a second level of steering logic in the steering fabric that routes one of a direct input signal for the macropad or a direct input signal from an adjacent macropad to a micropad in the given macropad; and
wherein the steering fabric limits the number of input signals that are routed to the micropad in the given macropad to eliminate redundant steering configurations for the array and to reduce the power needed to transmit the signal.

11. The computing device of claim 10,
wherein the limited number of input signals received by the given macropad is less than the number of micropads in the given macropad; and
wherein some of the input signals are routed to a limited set of micropads in the given macropad.

12. The computing device of claim 10, wherein one or more micropads for the given macropad are coupled to two or fewer of the input signals for the macropad.

13. The computing device of claim 12,
wherein multiplexers in the first level and the second level steering logic route the first and second direct input signals and the direct input signal from the adjacent macropad to a first set of one or more micropads in the given macropad;
wherein multiplexers in the first level and the second level steering logic route the first input signal and the direct input signal from the adjacent macropad to a second set of one or more micropads in the given macropad;
wherein multiplexers in the first level steering logic route the first input signal to a third set of one or more micropads in the given macropad;
wherein the first set, the second set, and the third set of micropads are distinct.

14. The computing device of claim 13,
wherein the micropads in the given macropad are organized as a rectangular grid; and
wherein at least one of a row and a column of micropads in the given macropad are limited to receive two or fewer input signals.

15. The computing device of claim 10, wherein the steering fabric facilitates electronic alignment techniques that use a set of micropads that span multiple macropads to transmit the signal to the receiving component using proximity communication.

16. The computing device of claim 10, wherein a redundant steering configuration occurs when multiple different sets of input values for the steering fabric result in the same configuration of transmit values for the array.

17. The computing device of claim 10,
wherein a fourth set of micropads in the given macropad have a higher probability of being driven by the first direct input signal during electronic alignment; and
wherein a signal line carrying the first direct input signal is routed in proximity to one or more micropads in the fourth set to reduce the parasitic capacitance between the signal line and the micropads of the macropad.

18. The computing device of claim 10, wherein the layout of the steering fabric for the given macropad is replicated across some or all of the macropads in the array of transmission pads.

19. A method that facilitates reducing the amount of power needed to transmit a signal via proximity communication, comprising:
transmitting a signal from a transmitting integrated circuit to a receiving integrated circuit using proximity communication;
wherein the transmitting integrated circuit includes an array of transmission pads that transmit a signal to the receiving integrated circuit using proximity communication, wherein the array comprises a set of macropads, wherein each macropad comprises a set of two or more micropads that can be configured to transmit one or more signals;
wherein the transmitting integrated circuit includes a steering fabric that routes signals to and within a given macropads such that a transmitting subset of the micropads in the given macropad transmits the signal to the receiving integrated circuit, wherein the steering fabric routes a first direct input signal and a second direct input signal to the given macropad;
using a first level of steering logic in the steering fabric to selectively route at least one of the first direct input signal and the second direct input signal to each of the micropads in the given macropad;
using a second level of steering logic in the steering fabric to route one of a direct input signal for the macropad or a direct input signal from an adjacent macropad to a micropad in the given macropad; and
wherein the steering fabric limits the number of input signals that are routed to a micropad in the given macropad to eliminate redundant steering configurations for the array and to reduce the power needed to transmit the signal.

20. The method of claim 19, wherein a redundant steering configuration occurs when multiple different sets of input values for the steering fabric result in the same configuration of transmit values for the array.

* * * * *